United States Patent [19]

Maeda et al.

[11] Patent Number: 4,560,421
[45] Date of Patent: Dec. 24, 1985

[54] SEMICONDUCTOR DEVICE AND METHOD OF MANUFACTURING THE SAME

[75] Inventors: Satoshi Maeda, Kawasaki; Hiroshi Iwai, Takaidonishi, both of Japan

[73] Assignee: Tokyo Shibaura Denki Kabushiki Kaisha, Japan

[21] Appl. No.: 307,877

[22] Filed: Oct. 2, 1981

[30] Foreign Application Priority Data

| Oct. 2, 1980 | [JP] | Japan | 55-137912 |
| Oct. 2, 1980 | [JP] | Japan | 55-137913 |
| Feb. 4, 1981 | [JP] | Japan | 56-15533 |
| Apr. 28, 1981 | [JP] | Japan | 56-65028 |
| Apr. 28, 1981 | [JP] | Japan | 56-65029 |
| Apr. 28, 1981 | [JP] | Japan | 56-65030 |
| May 1, 1981 | [JP] | Japan | 56-66475 |
| May 1, 1981 | [JP] | Japan | 56-66476 |
| Sep. 1, 1981 | [JP] | Japan | 56-137238 |
| Sep. 3, 1981 | [JP] | Japan | 56-138831 |
| Sep. 3, 1981 | [JP] | Japan | 56-138832 |
| Sep. 3, 1981 | [JP] | Japan | 56-138833 |

[51] Int. Cl.$^4$ ............................................. H01L 21/265
[52] U.S. Cl. ................................... 148/1.5; 29/571; 29/576 B; 156/628; 156/643; 156/659.1; 427/93; 427/94; 427/259
[58] Field of Search .......... 156/643, 659.1, 628; 29/576 B, 571; 148/1.5; 427/93,94, 259

[56] References Cited

U.S. PATENT DOCUMENTS

| 4,352,716 | 10/1982 | Schaible | 156/643 |
| 4,376,658 | 3/1983 | Sigusch | 148/1.5 |
| 4,377,438 | 3/1983 | Moriya | 156/643 |

Primary Examiner—John D. Smith
Attorney, Agent, or Firm—Finnegan, Henderson, Farabow, Garrett & Dunner

[57] ABSTRACT

Disclosed is a method of manufacturing a semiconductor device comprising a step of forming a field region formation insulating film on a semiconductor substrate, a step of forming a mask pattern covering a portion of the insulating film corresponding to an intended element region, a step of ion implanting a field inversion prevention impurity into an element isolation region of the substrate with the mask pattern used as a shield, a step of forming an etching-proof layer on a portion of the insulating film corresponding to a field region, a step of removing the mask pattern to let an etching-proof layer portion be left on the intended element isolation region, and a step of selectively etching the insulating film with the remaining etching-proof layer used as a mask to form the element isolation region. Also disclosed is a semiconductor device manufactured by making use of this method.

30 Claims, 86 Drawing Figures

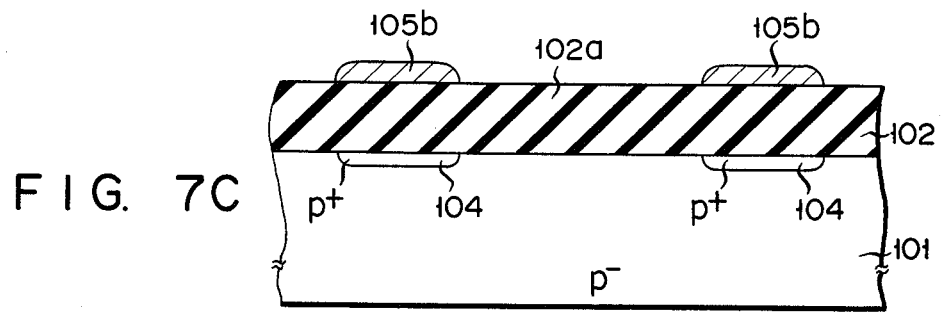
F I G. 7C
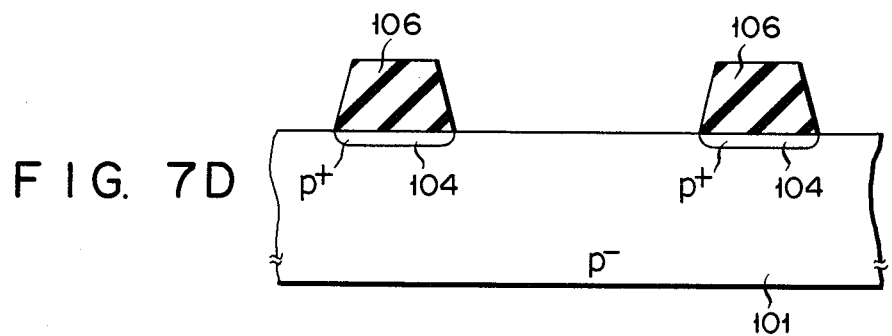
F I G. 7D
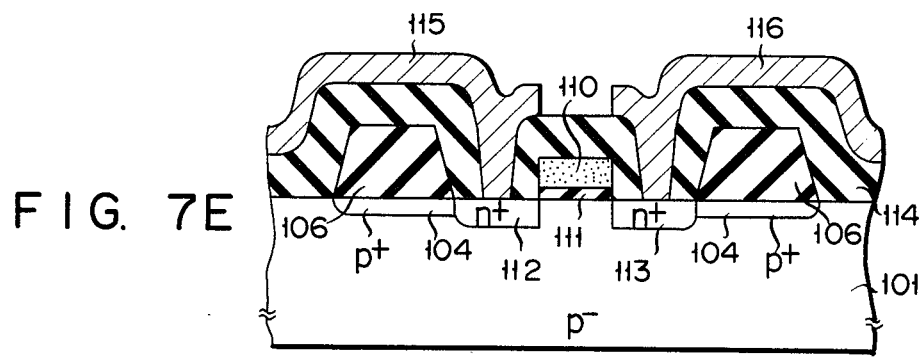
F I G. 7E

SEMICONDUCTOR DEVICE AND METHOD OF MANUFACTURING THE SAME

BACKGROUND OF THE INVENTION

This invention relates to a method of manufacturing semiconductor devices which includes an improved element isolation step and semiconductor devices manufactured by the method.

The manufacture of a semiconductor device involves a step of forming an element isolation region constituted by an insulator for isolating a transistor region (or element region) of a semiconductor substrate as is well known in the art. Particularly, recent higher density integration of semiconductor devices is calling for the establishment of finer element isolation region formation techniques.

Hitherto, a selective oxidation method has been used to form an element isolation region constituted by an insulator. In this method, a thermal oxidation film 2, as shown in FIG. 1A, is grown to a thickness of 1,000 Å on, for instance, a p-type silicon substrate 1 with plane index (100). A silicon nitride film 3 is then deposited to a thickness of, for instance, 2,000 Å on the film 3. Subsequently, a resist film 4 covering an element region is formed on the silicon nitride film 3 by using the photo-etching method. The silicon nitride film 3 is then etched with the resist film 4 used as a mask to form a silicon nitride film pattern 5 which serves as an oxidation-proof mask material. Afterwards, an element isolation layer field inversion prevention impurity (for instance boron) is ion implanted through the thermal oxidation film 2 into the substrate 1 with the resist film 4 used as a mask (as shown in FIG. 1B). The resist film 4 is then removed, and the wafer is thermally treated in a high temperature wet oxygen atmosphere with the silicon nitride film pattern 5 as a mask to form an isolation oxide film 6, for instance 1 μm thick, and a p+-type inversion prevention layer 7 thereunder (as shown in FIG. 1C). The silicon nitride film pattern 5 and thermal oxidation film 2 are removed afterwards (as shown in FIG. 1D).

In this prior art method, however, a so-called bird's beak 8, as shown in FIG. 1C, is formed as a result of intrusion of the element isolation oxide film 6 into the element region. The bird's beak increases the resist film pattern width; for example, if the bird's beak along one edge has a width dimension of 0.5 μm, a design resist film pattern width of, for instance 2 μm is increased to 3 μm. This means a reduction of the substrate area that can be used as the element area and is hence undesired from the standpoint of the formation of precision element isolation region and higher integration density. In addition, the p+-type inversion prevention layer 7 also intrudes into the element region as shown in FIG. 1D and has adverse effects upon a diffusion layer which may be formed as a surface layer in the element region. Further, nitrogen compounds are liable to be diffused from the silicon nitride film through the thermal oxidation film into the silicon substrate at the time of the thermal oxidation to result in the formation of a so called white ribbon layer on the silicon substrate.

SUMMARY OF THE INVENTION

The invention has been intended to preclude the above drawbacks inherent in the prior art, and to provide a method of manufacturing a high performance, high density semiconductor device, which permits formation of fine element isolation regions through a simple process and can prevent the diffusion of the field inversion prevention layer into the element region surface layer as well as the formation of the white ribbon, and also can provide a semiconductor device manufactured by such a method.

According to the invention, there is provided a method of manufacturing a semiconductor device comprising a step of forming a field region formation insulating film on a semiconductor substrate, a step of forming a mask pattern covering a portion of the insulating film corresponding to an intended element region, a step of ion implanting a field inversion prevention impurity into an element isolation region of the substrate with the mask pattern used as a shield, a step of forming an etching-proof layer on a portion of the insulating film corresponding to a field region, a step of removing the mask pattern to let an etching-proof layer portion be left on the intended element isolation region, and a step of selectively etching the insulating film with the remaining etching-proof layer used as a mask to form the element isolation region.

The invention further seeks to provide a semiconductor device including a complementary MOS field-effect transistor, in which a well is isolated either partly or totally from an element region other than the well by an insulating film provided along at least part or all of a borderline portion between the well or a lower element region portion other than the well and a semiconductor substrate.

According to the invention, the semiconductor substrate may be a p- or n-type silicon or other semiconductor substrate with or without a single crystal semiconductor film formed thereon.

The insulating film used for the formation of the element isolation region according to the invention may be a thermal oxidation or oxide film, a CVD-SiO$_2$ film, a silicon nitride film, an aluminum oxide film, etc.

The mask pattern according to the invention serves not only as a mask for the selective ion implantation of a field inversion prevention impurity or aluminum-denaturing impurity or as an aluminum anodic oxidation mask but also as a lift-off material for allowing an etching-proof cover to be left on a portion of the insulating film corresponding to the element isolation region. To fulfill these functions, the mask pattern material is required to have a selective etching property with respect to the insulating film and etching-proof film. Examples of such mask pattern material are various resists.

According to the invention, the doping has to be made by the ion implantation method in order to dope the semiconductor substrate with the field inversion prevention impurity through the insulating film. Desirably, the conditions of the ion implantation are suitably selected depending upon the kind and thickness of the insulating film.

In accordance with the invention, preliminary formation of an insulating film serving as an element isolation region on a semiconductor substrate, deposition of a cover film on the insulating film, formation of a mask pattern on a portion of the cover film corresponding to the element region and ion implantation of a field inversion prevention impurity with the mask pattern as a shield are carried out, whereby the doping of the semiconductor substrate with impurity is effected through the cover film and insulating film to form a field inversion prevention layer which is self-aligned to the mask pattern. Thus, the intrusion of the field inversion prevention layer into the element region can be prevented.

In addition, the manufacturing process according to the invention, eliminates the time-consuming field formation oxidation heat treatment step subsequent to the field boron ion implantation that is required in the prior art selective oxidation method, and the intrusion of the field inversion prevention layer can thus be avoided. Also, it is possible to avoid formation of the white ribbon having adverse effects on the growth of the thermal oxidation film on the semiconductor substrate surface. Thus, according to the invention a high performance, high integration density semiconductor device can be manufactured through a simple process.

Further, the invention is applicable not only to the manufacture of such MOS type semiconductor devices as dynamic RAMs and CMOSs but also to other MOS type semiconductor devices or bipolar semiconductor devices such as ECL and $I^2L$.

A first feature of the invention is a manufacturing method making use of a lift-off process. The basic concept of the element isolation by the lift-off process will now be described hereinafter in detail with reference to FIGS. 2A through 2F.

(i) A high resistivity p-type silicon substrate 11 (as shown in FIG. 2A) is subjected to a thermal oxidation treatment in a wet oxygen atmosphere, for instance at 1,000° C., to grow a thermal oxidation film 12 (insulating film), for instance 5,000 Å thick. Then, a photoresist film is coated on the entire wafer surface and selectively etched by the photoetching process to form a resist pattern 13 covering an element region.

(ii) Boron, a field inversion prevention impurity, is then selectively doped into the substrate 11 through the thermal oxidation film 12 by the ion implantation method with an acceleration voltage of 200 keV and a dose of $1 \times 10^{13}$ /cm$^2$ and with the resistor pattern 13 used as a mask to form a p$^+$-type inversion prevention layer 14. Subsequently, an aluminum cover film, for instance 2,000 Å thick, is formed by vacuum deposition on the entire wafer surface. At this time, the aluminum cover film is separated into a portion 15a on the resist pattern and a portion 15b on the thermal oxidation film (as shown in FIG. 2B). Thereafter, the resist pattern 13 is removed to lift off the aluminum cover film 15a on it and let the aluminum film 15b be left on a portion of the thermal oxidation film 12 corresponding to an intended element isolation region (as shown in FIG. 2C).

(iii) The thermal oxidation film 12 is then selectively etched by reactive ion etching using the remaining aluminum cover film 15b as a mask to form a field oxide film (element isolation region) 16, followed by removal of the remaining aluminum film 15b (as shown in FIG. 2D).

(iv) The wafer is then subjected to a thermal oxidation treatment to grow an oxide film, for instance 400 Å, which serves as a gate oxide film, on the exposed substrate surface. A phosphorus-doped polycrystalline silicon film is then deposited to a thickness of 4,000 Å on the entire surface and patterned by reactive ion etching to form a gate electrode 17 (as shown in FIG. 2E). The oxide film is then selectively etched with the electrode 17 as a mask to form a gate oxide film 18. Arsenic is then diffused with the gate electrode 17 and field oxide film 16 used as a mask to form n$^+$-type source and drain regions 19 and 20 in the silicon substrate 11 (as shown in FIG. 2F). Subsequently, a CVD-SiO$_2$ film 21 is deposited on the entire surface and is then processed to form contact holes. Finally, aluminum lead electrodes 22 and 23 are formed by depositing and patterning an aluminum film, thus obtaining a MOS type semiconductor device.

The first mode utilizing the lift-off process as described above, is a method of manufacturing a semiconductor device, which comprises a step of forming an insulating film on a semiconductor substrate and then forming a mask pattern covering a portion of the insulating film corresponding to an intended element region, a step of ion implanting a field inversion prevention impurity into an intended element isolation region of the substrate with the mask pattern used as a shield, a step of depositing a cover film on the insulating film inclusive of the mask pattern and then removing the mask pattern to selectively lift off the cover film thereon and let a portion of the cover film be left on a portion of the insulating film corresponding to the intended element isolation region, a step of selectively etching the insulating film with the remaining cover film as a mask to form the element isolation region, a step of depositing a non-monocrystal semiconductor layer and irradiating this layer with an energy beam to convert it into a single crystal semiconductor layer, a step of depositing silicon nitride on the single crystal semiconductor layer to form a silicon nitride film on a region of the single crystal semiconductor layer at least including a recessed portion thereof corresponding to a portion of the semiconductor substrate isolated by the element isolation region, and a step of processing the silicon nitride film by a reactive ion etching method to let the silicon nitride film be selectively left only on the recessed portion of the single crystal semiconductor layer and then etching by means of a reactive ion etching method the single crystal semiconductor layer and the remaining silicon nitride film at nearly the same etching rate until the remaining nitride film is completely etched off to form an element region consisting of the single crystal semiconductor layer on a portion of the semiconductor substrate isolated by the element isolation region.

A second mode of the invention is a method of manufacturing a semiconductor device, which comprises a step of forming an insulating film on a semiconductor substrate and then forming a mask pattern covering a portion of the insulating film corresponding to an intended element region, a step of ion implanting an inversion prevention impurity into an element isolation region of the substrate with the mask pattern as a shield, a step of depositing a cover film on the insulating film inclusive of the mask pattern and then removing the mask pattern to selectively lift off the cover film thereon and let a cover film portion be left on a portion of the insulating film corresponding to an intended element isolation region, a step of selectively etching the insulating film with the remaining cover film as a mask to form the element isolation region, a step of depositing a non-monocrystal semiconductor layer, a step of depositing a silicon nitride on the non-monocrystal semiconductor layer to form a silicon nitride film on a region of the non-monocrystal semiconductor layer including at least a recessed portion thereof corresponding to a portion of the semiconductor substrate isolated by the element isolation region and then selectively etching the silicon nitride film by a reactive ion etching method to let a silicon nitride film portion be left only on the recessed portion of the non-monocrystal semiconductor layer, and a step of selectively etching by means of a reactive ion etching method the non-monocrystal semiconductor layer and the remaining silicon nitride film at nearly the same etching rate until the nitride film is completely etched off to let a semiconductor layer portion be left on a portion of the substrate isolated by the element isolation region and then irradiating the remaining non-monocrystal semiconductor layer with an energy beam to convert it into a single crystal semiconductor layer.

The cover film in the first and second modes is required to have the property of permitting the selective etching of both the mask pattern and the insulating film, because it is patterned by the lift-off through the removal of the mask pattern and is utilized as the resultant patterned etching mask (remaining film) for selectively etching the insulating film. The material of the cover film may be aluminum or aluminum alloys such as Al-Si and Al-Cu-Si or other metals such as Mo, W and Ni. The materials may also be imparted with a selective etching property through anodic oxidation or ion implantation.

The non-monocrystal semiconductor layer in the first and second modes, is used as the starting material for the element region which is formed by selective etching and irradiation with an energy beam. Examples of this non-monocrystal semiconductor layer are a polycrystalline silicon layer and amorphous silicon layer.

The deposition of the silicon nitride on the non-monocrystal semiconductor layer in the first and second modes is required in order that the silicon nitride film formed on the recessed portion of the non-monocrystal semiconductor layer corresponding to the portion of the substrate isolated by the element isolation region may have a slower etching rate with respect to the reactive ion etching than the silicon nitride film on the rest of the non-monocrystal semiconductor layer. The processing of this silicon nitride film through the reactive ion etching permits selective removal of the silicon nitride film on the other portion of the non-monocrystal semiconductor layer than the recessed portion. Thus, by etching with a reactive ion etching method the non-monocrystal semiconductor layer and the silicon nitride film, a self-aligned non-monocrystal semiconductor layer can be obtained only on the portion of semiconductor substrate that corresponds to the element region.

The irradiation with the energy beam in the first and second modes is done in order to convert the non-monocrystal semiconductor layer on the portion of the semiconductor substrate isolated by the element isolation region into a single crystal layer to thereby form the element region. As the energy beam, a laser beam or an electron beam may be used.

A third mode of the invention which again makes use of the lift-off process is a method of manufacturing a semiconductor device, which comprises a step of forming a thick insulating film serving as a field insulating film on a semiconductor substrate, a step of covering the insulating film with a protective film having a property of permitting selective etching of a film formed on a portion of the insulating film corresponding to an element region, a step of forming a resist pattern covering a portion of the protective film corresponding to an intended element region, a step of ion implanting an inversion prevention impurity into an intended region of the substrate with the resist pattern as a mask, a step of depositing a cover film over the entire surface inclusive of the resist pattern and then removing the resist pattern to selectively lift off the cover film thereon and let a portion of the cover film be left on the portion of the protective film corresponding to the intended field region, and a step of selectively etching the protective film and insulating film with the remaining cover film as a mask to form the field insulating film.

The protective film in the first and second modes has a purpose of protecting the field insulating film against etching, and thus it is required to have a property of permitting selective etching of a film (for instance a thermal oxidation film) formed on the element region. Examples of the material of this protective film are silicon nitride, alumina, polycrystalline silicon, etc. The thickness of the protective film is desirably 500 to 1,500 Å.

The cover film in the first and second modes serves as a cover film pattern for the formation of the field insulating film by lift-off through the removal of the resist pattern. Examples of the cover film material are aluminum, aluminum alloys such as Al-Si and Al-Cu-Si and other metals such as Mo, W and Ni.

A fourth mode of the invention making use of the lift-off process is a method of manufacturing a semiconductor device, which comprises a step of forming a thick insulating film to serve as a field insulating film on a semiconductor substrate and processing the film such that its superficial portion has a higher etching rate than the rest of it, a step of forming a resist pattern covering a portion of the insulating film corresponding to an intended element region, a step of ion implanting a field inversion prevention impurity into a field region of the substrate with the resist pattern as a mask, a step of depositing a cover film on the entire surface inclusive of the resist pattern and then removing the resist pattern to selectively lift off the cover film thereon and let the rest of the cover film be left on the portion of the insulating film corresponding to the intended field region, and a step of selectively etching the insulating film with the remaining cover film as a mask to form a tapering field insulating film.

The processing of the insulating film such that its superficial portion has a higher etching rate than the rest of it in the fourth mode, is done in order to form a tapering field oxide film by making use of the difference in the etching speed at the time of the etching with the residual cover film used as a mask. The processing is effected by, for instance, (a) covering the insulating film with a film of a material having a higher etching rate than the insulating film or (b) subjecting the insulating film to active radical bombardment. The cover film used in the method (a) may be of such material as phosphorus-containing glass (PSG), arsenic-containing glass (AsSG) and boron and phosphorus-containing glass (BPSG). The active radical used in the method (b) may be active $CF_4$ and $C_2F_6$ gases.

The cover film in the fourth mode serves as a cover film pattern (residual film) for the formation of the field insulating film by lift-off through removal of the resist pattern, and is thus required to have a property of permitting the selective etching of the insulating film. However, where the insulating film is covered by a film of a material having a higher etching rate, the cover film is also required to have a property of permitting the selective etching of this film as well. Examples of the material of the cover film are aluminum, aluminum alloys such as Al-Si and Al-Cu-Si and other metals such as Mo, W and Ni.

A fifth mode of the invention making use of the lift-off process is a method of manufacturing a semiconductor device, which comprises a step of forming an insulating film on a semiconductor substrate and forming a mask pattern covering a portion of the insulating film corresponding to an intended element region, a step of ion implanting a field inversion prevention impurity into an intended element isolation region of the substrate with the mask pattern as a shield, a step of depositing a cover film on the insulating film inclusive of the mask pattern and then removing the mask pattern to selectively lift off the cover film portion thereon and let the rest of the cover film be left on the portion of the insulating film corresponding to an intended element isolation region, a step of selectively etching the insulating film with the remaining cover film as a mask to form the element isolation region, and a step of depositing a single crystal semiconductor layer by the selective epitaxial growth method on the portion of the substrate isolated by the element isolation region.

A sixth mode of the invention making use of the lift-off method is a method of manufacturing a semiconductor device, which comprises a step of forming an insulating film on a semiconductor substrate and then forming a mask pattern to cover a portion of the insulating film corresponding to an intended element region, a step of ion implanting a field inversion prevention impurity into an intended element isolation region of the substrate with the mask pattern as a shield, a step of depositing a cover film on the insulating film inclusive of the mask pattern and then removing the mask pattern to selectively lift off the cover film portion thereon and let the rest of the cover film be left on a portion of the insulating film corresponding to the intended element isolation region, a step of selectively etching the insulating film with the remaining cover film as a mask to form the element isolation region, a step of epitaxially growing silicon on the entire surface to form a single crystal silicon layer atop the substrate isolated by the element isolation region and a polycrystalline silicon layer atop the element isolation region, and a step of selectively etching the polycrystalline silicon layer.

The cover film in the fifth and sixth modes is required to have a property permitting selective etching of both the mask pattern and insulating film, because it is patterned by lift-off through removal of the mask pattern and the resultant patterned cover film (remaining cover film portion) is utilized as a mask for selectively etching the insulating film. Examples of the material of this cover film are aluminum, aluminum alloys such as Al-Si and Al-Cu-Si and other metals such as Mo, W and Ni.

A seventh mode of the invention making use of the lift-off process is a method of manufacturing a complementary MOS type semiconductor device, which comprises a step of forming an insulating film on a semiconductor substrate and then forming a mask pattern covering a portion of the insulating film corresponding to an intended element region, a step of ion implanting an inversion prevention impurity into an intended element isolation region of the substrate with the mask pattern as a shield, a step of depositing a cover film on the insulating film inclusive of the mask pattern and then removing the mask pattern to selective lift off the cover film portion thereon and let the rest of the cover film be left on the portion of the insulating film corrresponding to the intended element isolation region, a step of selectively etching the insulating film with the remaining cover film as a mask to form the element isolation region, a step of forming an insulating film on the semiconductor substrate constituting at least part of the element region corresponding to a well region or a portion other than the well region, a step of depositing a non-monocrystal semiconductor layer on the entire surface, a step of converting the non-monocrystal semiconductor layer into a single crystal layer through irradiation with an energy beam, a step of depositing silicon nitride on the single crystal semiconductor layer to form a silicon nitride film over an area at least including a recessed portion of the single crystal semiconductor layer corresponding to the region isolated by the element isolation region, and a step of selectively etching the silicon nitride film by reactive ion etching to let a portion of the silicon nitride film be left on the recessed portion of the single crystal semiconductor layer and then etching by means of a reactive ion etching method the single crystal semiconductor layer and the remaining nitride film at nearly the same etching rate until the nitride film is completely etched off to form the element region consisting of the single crystal semiconductor layer or a portion of the substrate isolated by the element isolation region.

The conditions of the individual steps of the seventh mode are the same as those in the case of the first mode.

The second feature of the invention makes use of a method in which the etching-proof cover film used as a mask for the element isolation region insulating film is partly denatured to thereby impart the denatured portion with a selective etching property with respect to the non-denatured portion.

An eighth mode of the invention, which makes use of the denatured cover film, is a method of manufacturing a semiconductor device, which comprises a step of forming an insulating film on a semiconductor substrate and then depositing a cover film having a selective etching property on the insulating film, a step of forming a mask pattern on a portion of the cover film corresponding to an intended element region, a step of selectively ion implanting an impurity into the cover film with the mask pattern as a shield and also selectively ion implanting a field inversion prevention impurity into the substrate through the cover film and insulating film with the same mask pattern used as a shield, a step of removing the mask pattern and then etching the total cover film to leave a portion thereof doped with the impurity, and a step of selectively etching the insulating film with the remaining film as a mask to form the element isolation region.

The cover film formed in the eighth mode is required to have a property of permitting the selective etching of the insulating film, because it is formed into a mask for selectively etching the insulating film (residual film) through the ion implanting of the field inversion prevention impurity and the subsequent mask-free etching. Examples of the material of the cover film are aluminum, aluminum alloys such as Al-Si and Al-Cu, other metals and silicides of metals such as molybdenum silicide, tantalum silicide, tungsten silicide and platinum silicide.

The ion implantation of impurity into the cover film portion not covered by the mask pattern in the eighth mode is done because of a finding that the impurity-doped cover film thus formed in the ion implantation step is not etched at all or is etched very slightly in the following etching step. By removing the mask pattern after the ion implantation of the impurities and processing the system with an etchant that is effective to etch a cover film portion which is not doped with any ion implantation impurity, it is possible to leave only the impurity-doped cover film portion, that is, it is possible to leave the cover film only on the portion of the insulating film corresponding to the intended element isolation region. The step of the selective ion implantation of impurity into the cover film and the step of the selective ion implantation of the field inversion prevention impurity into the semiconductor substrate through the cover film and insulating film may be carried out in any desired order, that is, either one of these steps may be carried out first, or they may be carried out simultaneously. Desirably, the conditions of the ion implantation of the field inversion prevention impurity may be suitably selected depending upon the kind and thickness of the cover film and insulating film.

According to the eighth mode of the invention, the impurity doping by ion implantation has an effect of obtaining different etching rates for the impurity-free cover film portion underneath the mask pattern and for the impurity-doped cover portion so that these portions are given properties of permitting the selective etching of each other. By the subsequent mask-free etching, the impurity-free cover film portion is selectively removed to leave the rest of the cover film on the portion of the insulating film corresponding to the element isolation region. Thus, by using this remaining film as a mask for selectively etching the exposed insulating film portion, it is possible to obtain an element isolation region, which is free from any bird's beak and has the intended area. Further, the process is free from any time consuming field formation layer oxidation heat treatment step subsequent to the field boron ion implantation as in the prior art selective oxidation method. Thus, it is possible to avoid the intrusion of the field inversion prevention layer and also prevent the generation of the white ribbon which impedes the growth of the thermal oxidation film on the semiconductor substrate surface.

This eighth mode of the invention making use of the denatured cover film may also be applicable to the above-mentioned seven modes (the first mode through the seventh mode) of embodiments by replacing the lift-off method with this cover film denaturing method.

A ninth mode of the invention making use of the denatured cover film is a method of manufacturing a semiconductor device, which comprises a step of forming an insulating film on a semiconductor substrate and then depositing a cover film capable of permitting the selective etching of the insulating film, a step of forming a mask pattern covering a portion of the cover film corresponding to an intended element region, a step of ion implanting a field inversion prevention impurity into an intended element isolation region of the substrate through the cover film and insulating film with the mask pattern used as a shield, a step of oxidizing or nitrifying the cover film with the shield member as a mask, a step of removing the mask pattern and then selectively removing the oxide or nitride film, and a step of selectively etching the insulating film with the remaining cover film as a mask to form the element isolation region.

In the ninth mode, the oxidation of the cover film may be effected by anodic oxidation.

This ninth mode of the invention making use of the denatured cover film may also be applicable to the above-mentioned seven modes (the first mode through the seventh mode) of embodiments by replacing the lift-off method with this cover film denaturing method.

A tenth mode of the invention makes use of a reverse etching process using a reactive gas containing hydrogen fluoride. More particularly, this mode is a method of manufacturing a semiconductor device, which comprises a step of forming a thick insulating film deemed to serve as a field insulating film on a semiconductor substrate, a step of forming a resist pattern covering an intended element region, a step of ion implanting a field inversion prevention impurity into a field region of the substrate with the resist pattern as a mask, and a step of selectively etching the insulating film under the resist film by exposure to a reactive gas containing hydrogen fluoride to form the field insulating film.

This tenth mode of the invention making use of a reverse etching process may also be applicable to the above-mentioned seven modes (the first mode through the seventh mode) of embodiments by replacing the lift-off method with this tenth mode method.

BRIEF DESCRIPTION OF THE DRAWINGS

FIGS. 3A to 3J, 4A to 4E, 5A to 5K, 6A to 6G, 7A to 7E, 8A to 8B, 9, 10, 11A and 11B, 12A to 12L, 13A to 13G, 14A to 14F, 15A to 15D and 16A to 16C are sectional views useful to explain element isolation region formation processes in other examples of the invention.

DETAILED DESCRIPTION OF THE PREFERRED EMBODIMENTS

Examples of the invention applied to the manufacture of MOS type semiconductor devices will now be described with reference to the drawings.

Example 1

Figure 1A:
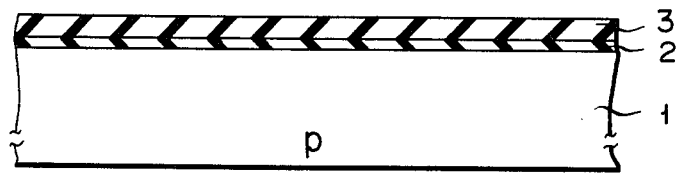
FIGS. 1A to 1D are sectional views useful to explain a prior art process of forming a semiconductor device element isolation region.
Figure 1B:
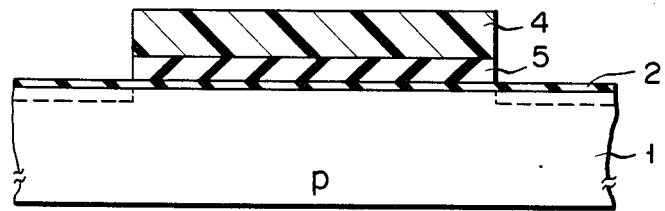
Figure 1C:
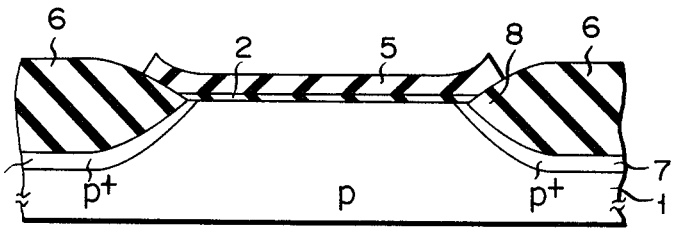
Figure 1D:
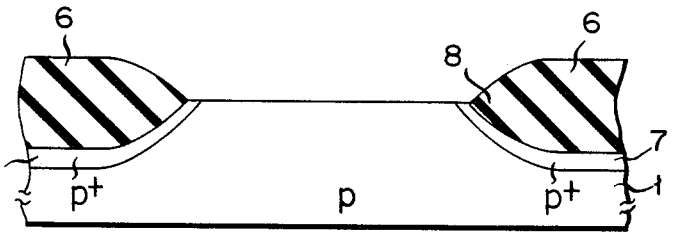
Figure 2A:
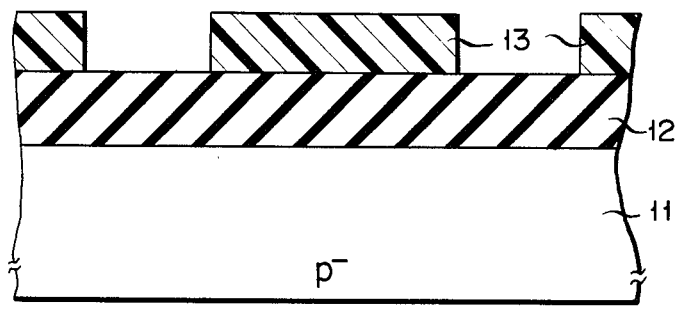
FIGS. 2A to 2F are sectional views useful to explain a semiconductor device element isolation region formation process according to the invention.
Figure 2B:
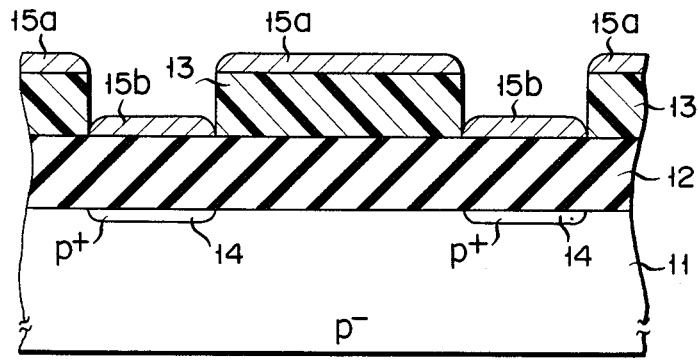
Figure 2C:
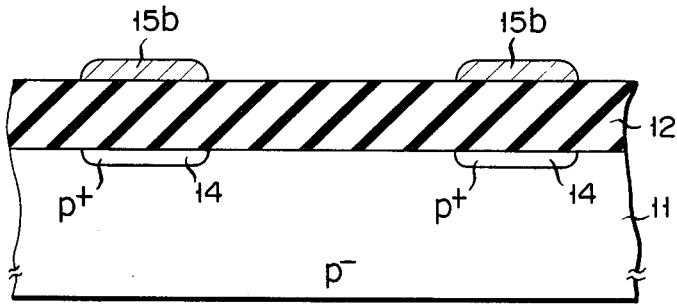
Figure 2D:
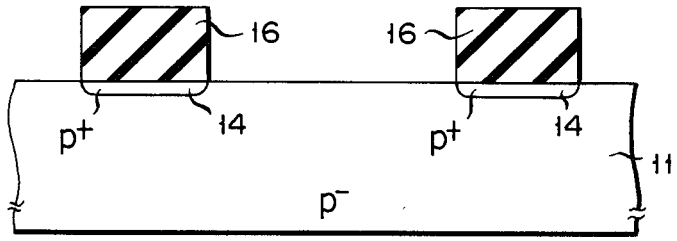
Figure 2E:
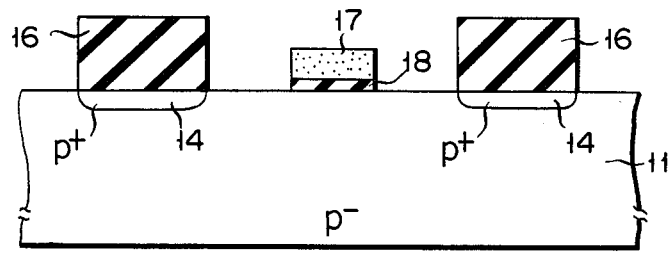
Figure 2F:
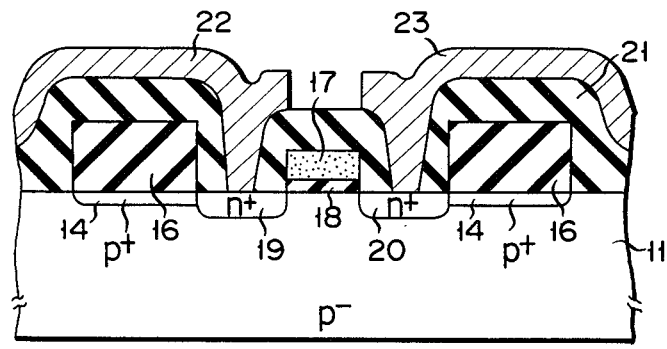
Figure 3A:
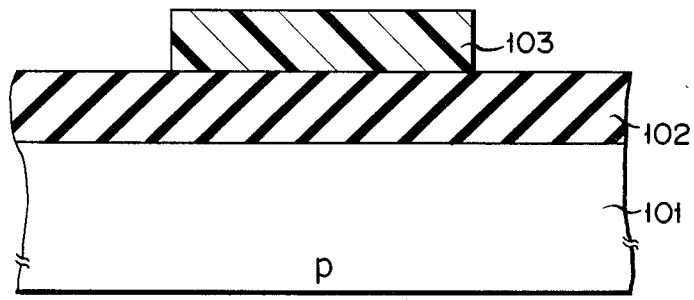
Figure 3B:
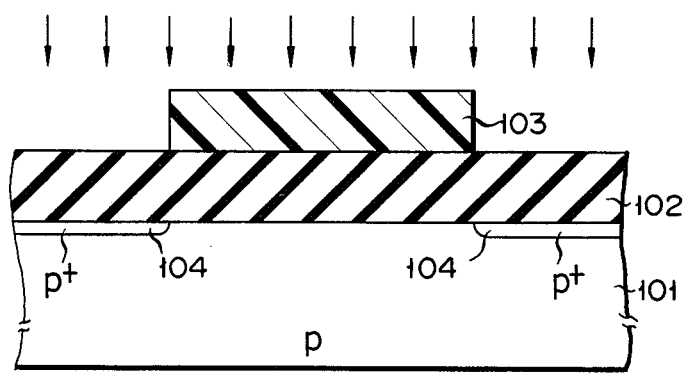
Figure 3C:
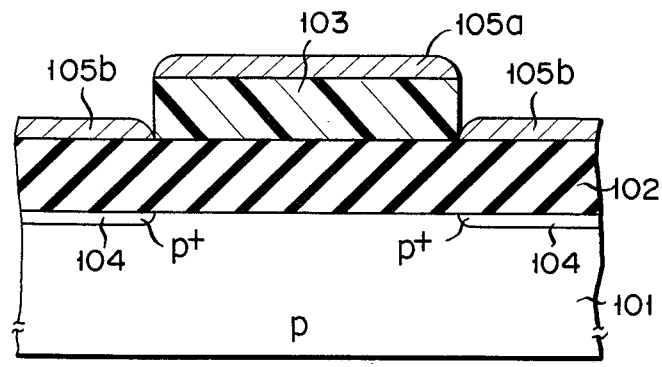

[i] A p-type silicon substrate 101 with plane index (100) was subjected to a thermal oxidation treatment in a wet oxygen atmosphere at 1,000° C. to grow a thermal oxidation film (insulating film) 102 with a thickness of 5,000 Å, as shown in FIG. 3A. A photoresist film was then coated on the entire surface and patterned by the photoetching method to form a resist pattern (mask pattern) 103 covering an intended element region. Subsequently, boron was selectively ion implanted as a field inversion prevention impurity into the substrate 101 through the thermal oxidation film 102 with an acceleration voltage of 200 keV and a dose of $1 \times 10^{13}/cm^2$ and with the resist pattern 103 used as a mask, followed by a heat treatment to form a p$^+$-type field inversion prevention layer 104 (as shown in FIG. 3B).

Figure 3D:
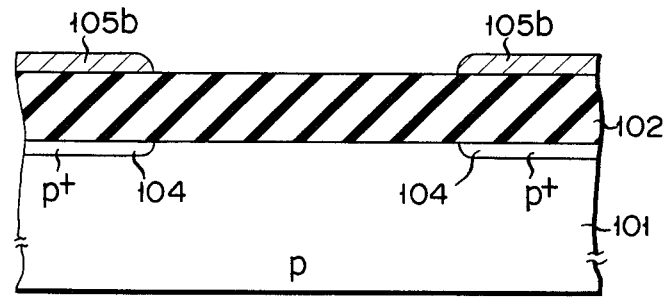
Figure 3E:
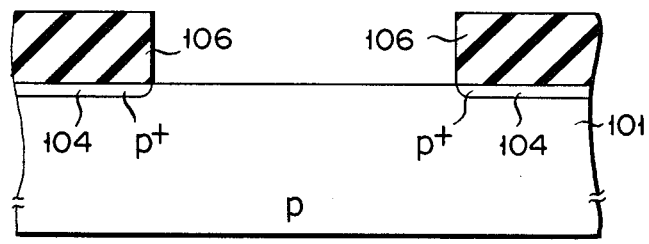

[ii] An aluminum cover film was then vacuum deposited to a thickness of 2,000 Å on the entire surface. At this time, the aluminum cover film was separated into an aluminum cover film 105a on the resist pattern 103 and an aluminum cover film 105b on the thermal oxidation film 102 due to a step portion between the resist pattern 103 and thermal oxidation film 102. Subsequently, the resist pattern 103 was removed to lift off the aluminum cover film 105a on it and let the aluminum cover film 105b be left on a portion of the thermal oxidation cover film 102 corresponding to an intended element isolation region (as shown in FIG. 3D). Thereafter, the thermal oxidation film 102 was selectively etched by reactive ion etching with the remaining aluminum cover film 105b as a mask to form the element isolation region (field oxide film) 106. Afterwards, the remaining aluminum cover film 105b on the element isolation region 106 was removed (as shown in FIG. 3E).

Figure 3F:
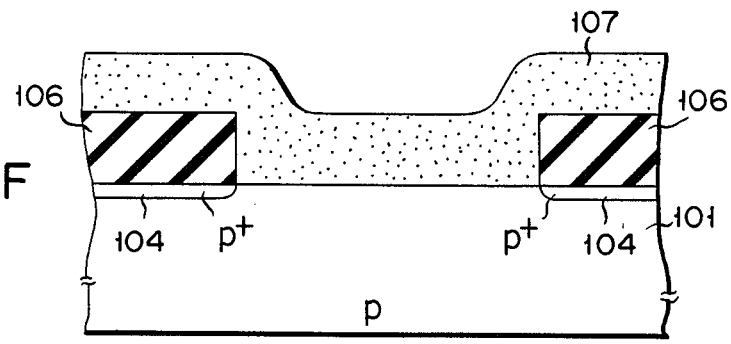
Figure 3G:
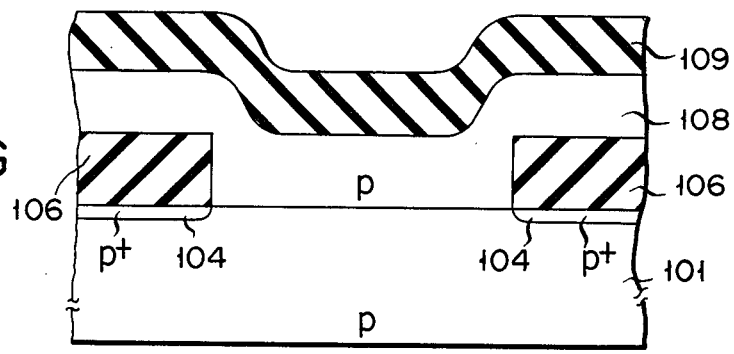
Figure 3H:
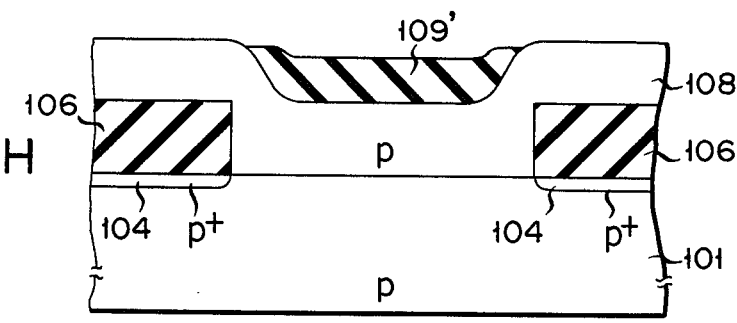
Figure 3I:
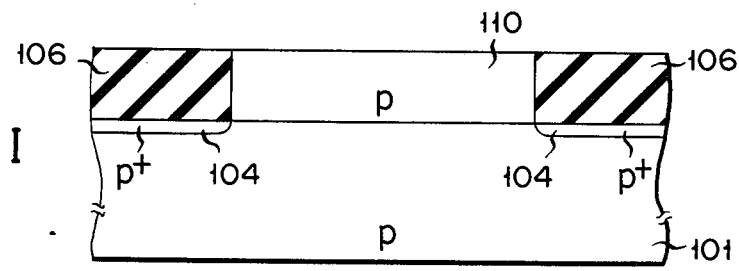

[iii] A polycrystalline silicon layer 107 having the same thickness as the element isolation region 106 was then deposited on the entire surface as shown in FIG. 3F. Subsequently, the entire surface of the polycrystalline silicon layer 107 is irradiated with a laser beam to convert the layer 107 into a p-type crystal silicon layer 108. The portion of silicon substrate 101 interfacing with the layer 107 provides nuclei of crystallization. A silicon nitride film 109 was then deposited on the single crystal silicon layer 108 (as shown in FIG. 3G) and etched by reactive ion etching. At this time, as shown in FIG. 3H a portion of the silicon nitride film deposited on the recessed portion of the single crystal silicon layer 108 was etched at a lower rate than the rest of the silicon nitride layer on the flat single crystal silicon layer portion. Thus, a silicon nitride film 109' was left in a self-aligned fashion only on the recess of the single crystal silicon layer 108. The single crystal silicon layer 108 and remaining silicon nitride film 109' were etched by means of reactive ion etching at nearly the same etching rate so as to form an element region 110 consisting of the p-type single crystal silicon layer on the island portion of the silicon substrate 101 isolated by the element isolation region 106 (as shown in FIG. 3I). Prior to the formation of source and drain regions to be described hereinafter, a p-type impurity such as boron may be further doped into the single crystal silicon layer element region 110 for the threshold value control thereof.

Figure 3J:
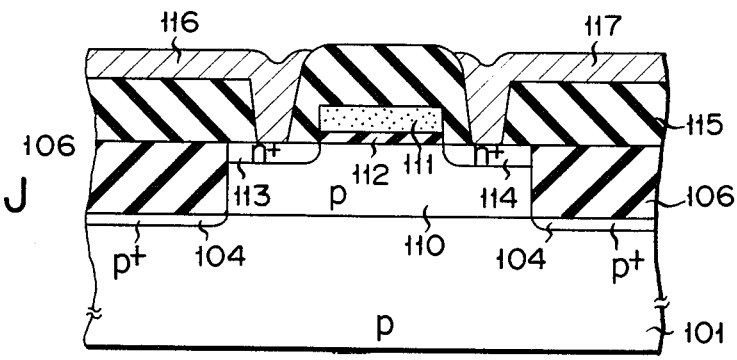

[iv] An oxide film with a thickness of 400 Å was then grown by thermally oxidizing the p-type single crystal silicon element region 110 isolated by the element isolation region 106. A phosphorus-doped polycrystalline silicon film with a thickness of 3,000 Å was then deposited on the entire surface and photoelectrically etched to form a resist pattern. The polycrystalline silicon film was then patterned by active ion etching with the resist pattern used as a mask to form a gate electrode 111, followed by the selective etching of the oxide film with the electrode 111 as a mask to form a gate oxide film 112. Subsequently, arsenic was diffused or ion implanted into the p-type single crystal silicon element region 110 with the gate electrode 111 and element isolation region 106 as a mask to form n+-type source and drain regions 113 and 114. A CVD-SiO$_2$ film 115 was then deposited on the entire surface and provided with contact holes. Thereafter, an aluminum film was vacuum deposited and patterned to form an aluminum gate lead electrode (not shown) and aluminum source and drain lead electrodes 116 and 117, thus completing a MOS type semiconductor device (as shown in FIG. 3J).

It will be understood that according to the invention a p-type single crystal silicon element region 110, which is substantially flush with the element isolation region 106 as shown in FIG. 3I, can be formed very simply on the portion of the silicon substrate 101 isolated by the element isolation region 106.

Example 2

This example is substantially the same as the preceding Example 1 except that the order of the steps for the conversion of the polycrystalline silicon into the single crystal silicon by annealing with a laser is changed. The steps in FIGS. 3A through 3E, i.e., the steps [i] and [ii], are entirely the same. The following description will thus be made beginning with the steps after the step of FIG. 3E and with reference to FIGS. 4A through 4E.

Figure 4A:
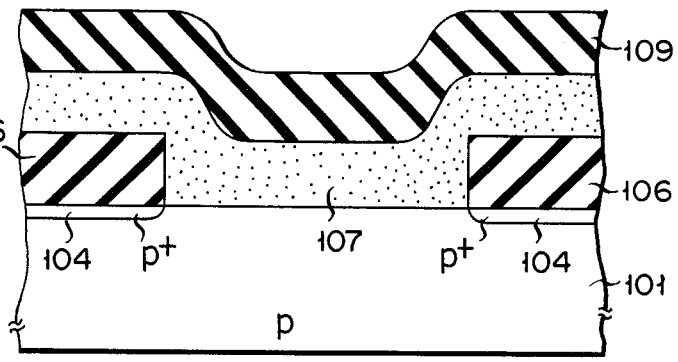
Figure 4B:
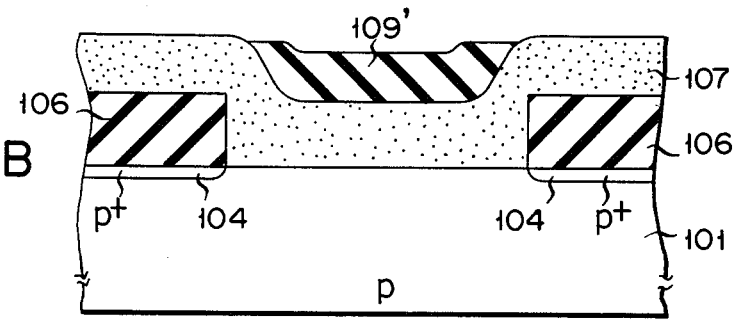
Figure 4C:
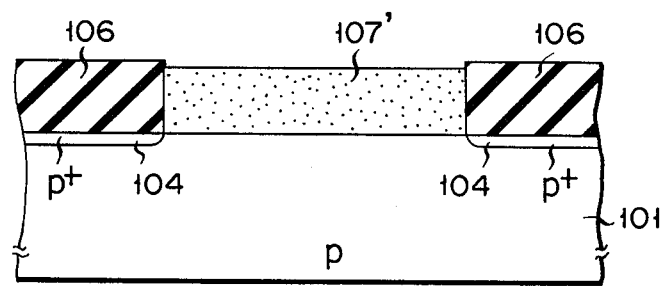
Figure 4D:
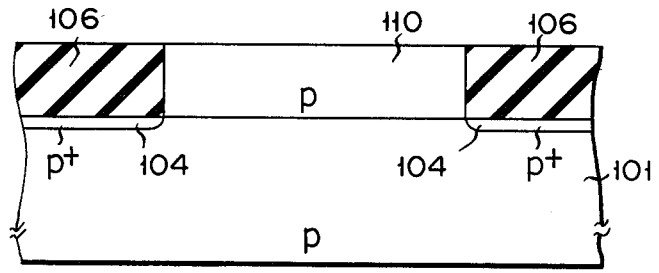

[iii] After the step [ii] (FIG. 3E), a polycrystalline silicon layer 107 having the same thickness as the element isolation region 106 was deposited on the entire surface as shown in FIG. 4A, and a silicon nitride film 109 was deposited on the polycrystalline silicon layer 107, followed by processing by reactive ion etching. In this step, a portion of the silicon nitride film 109 deposited on the recessed portion of the polycrystalline silicon layer 107 was etched at a lower rate than the rest of the silicon nitride film 109 on the flat portion of the layer 107, with a result that a silicon nitride film 109' was left in a self-aligned fashion only on the recessed portion of the polycrystalline silicon layer 107. Subsequently, the polycrystalline silicon layer 107 and the remaining silicon nitride film 108' were etched by means of a reactive ion etching method at nearly the same etching rate so as to form a polycrystalline silicon layer 107' only on the island portion of the silicon substrate 101 isolated by the element isolation region 106 as shown in FIG. 4C. Thereafter, the remaining polycrystalline silicon layer 107' was irradiated with a laser beam to convert it into a single crystal silicon layer with the portion of the silicon substrate 101 interfacing with the layer 107' providing nuclei of crystallization, thus forming an element region 110 consisting of the p-type single crystal silicon layer (as shown in FIG. 4D). Prior to the formation of source and drain regions to be described hereinafter, a p-type impurity such as boron may be doped into the single crystal silicon layer element region 110 for controlling the threshold value thereof.

Figure 4E:
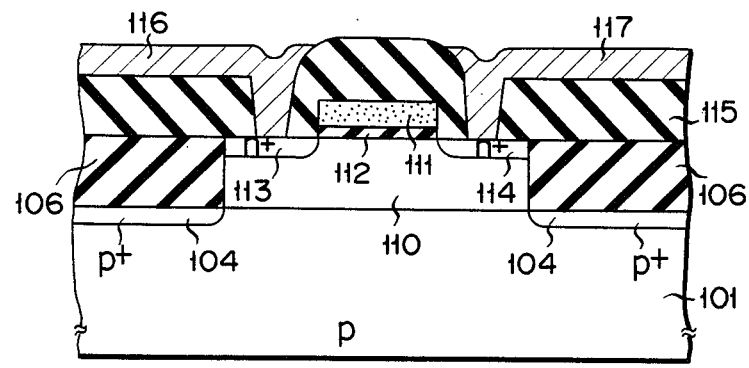

[iv] The p-type single crystal silicon element region 110 isolated by the element isolation region 106 was then thermally oxidized to grow a thermal oxidation film with a thickness of 400 Å. A phosphorus-doped polycrystalline silicon film was then deposited on the entire surface and patterned by the photoetching process to form a resist pattern. The polycrystalline silicon film was then patterned by reactive ion etching with the resist pattern as a mask to form a gate electrode 111. The oxide film was then selectively etched with the electrode 111 as a mask to form a gate oxide film 112. Subsequently, arsenic was diffused or ion implanted into the p-type single crystal silicon element region with the gate electrode 111 and element isolation region 106 as a mask to form n+-type source and drain regions 113 and 114. Thereafter, a CVD-SiO$_2$ film 115 is deposited on the entire surface and provided with contact holes. Finally, an aluminum film was vacuum deposited and patterned to form an aluminum gate lead electrode (not shown) and aluminum source and drain lead electrodes 116 and 117, thus obtaining a MOS type semiconductor device (as shown in FIG. 4E).

It is to be understood that according to the invention the p-type single crystal silicon element region 110 which is flush with the element isolation region 106 as shown in FIG. 4D can be formed very simply in the portion of the silicon substrate 101 isolated by the element isolation region 106.

In Examples 1 and 2, the element region 110 and element isolation region 106, which are flush with respect to each other, i.e., without any step with respect to each other, can be formed on the silicon substrate. Thus, it is possible to avoid any remaining resist film along the edges of the element isolation region 106 that may otherwise result at the time of its photoetching after the growth of the oxide film and subsequent deposition of the phosphorous-doped polycrystalline silicon film in the step [iv]. This enables formation of a resist pattern having satisfactory dimensional precision and hence the high precision formation of the gate electrode 111. In addition, with the element isolation region 106 and p-type single crystal silicon element region 110 formed flush with each other, it is possible to prevent the phosphorus-doped polycrystalline silicon film deposited in the step [iv] from remaining on a portion of the element region 110 in the neighborhood of the element isolation region 106 after the selective etching of the polycrystalline silicon by the reactive ion etching with the resist pattern as a mask. Thus, it is possible to obtain a highly reliable MOS type semiconductor device, which is free from any short-circuit of the gate electrode 111 to the source 113 or drain region 114. Further, it is possible to prevent breakage of the aluminum lead electrodes 116 and 117 at the edges of the element isolation region 106 at the time of their formation in the step [iv].

Furthermore, bird's beak that tends to be formed in the selective oxidation method is not formed at all in the process of forming the element isolation region according to the invention. Thus, the element isolation region 106 can be layed out without any allowance for a size reduction of the element region 110 due to any bird's beak. This permits manufacture of a higher integration density MOS type semiconductor device.

Now, an example of the invention applied to a MOS dynamic RAM having a two-layer gate electrode structure will be described with reference to FIGS. 5A through 5K.

EXAMPLE 3

Figure 5A:
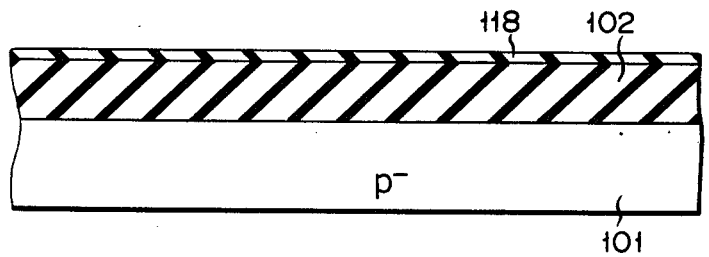
Figure 5B:
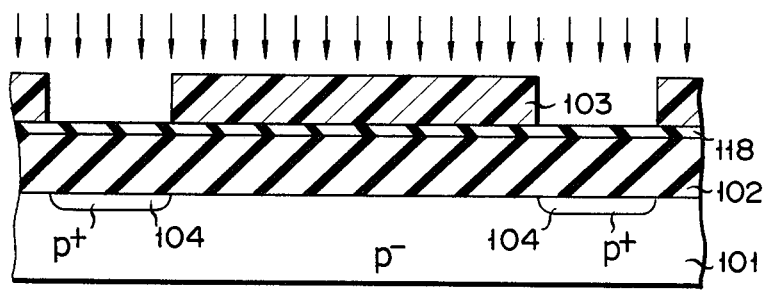

[i] A p type silicon substrate 101 with plane index <100> was subjected to a thermal oxidation treatment in a wet oxygen atmosphere at 1,000° C. to grow a thermal oxidation film (insulating film) 102 with a thickness of 5,000 Å as shown in FIG. 5A. A silicon nitride film 118 with a thickness of 1,000 Å was then formed as a protective film on the thermal oxidation film 102. Instead of the thermal oxidation film, a CVD-SiO$_2$ film may be substituted. Subsequently, a resist pattern 103 covering a portion of the silicon nitride film 118 corresponding to an intended element region was formed by the photoetching method. Thereafter, boron, a field inversion prevention impurity, was selectively doped by ion implantation into the substrate 101 through the silicon nitride film 118 and thermal oxidation film 102 with an acceleration voltage of 240 keV and a dose of $1 \times 10^{13}/cm^2$ using the resist pattern 103 as a mask, followed by a heat treatment to obtain a p+-type field inversion prevention layer 104 (as shown in FIG. 5B).

Figure 5C:
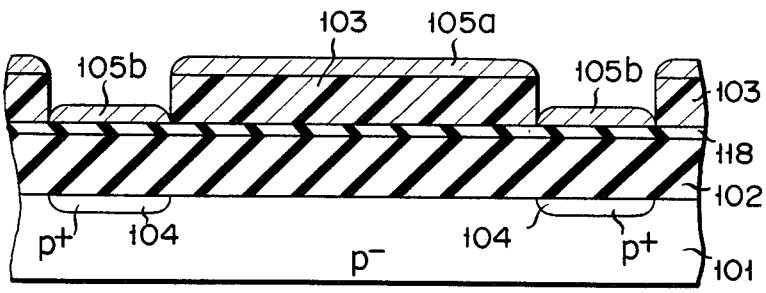
Figure 5D:
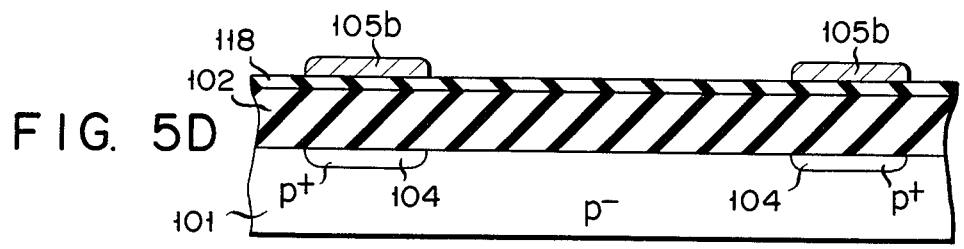
Figure 5E:
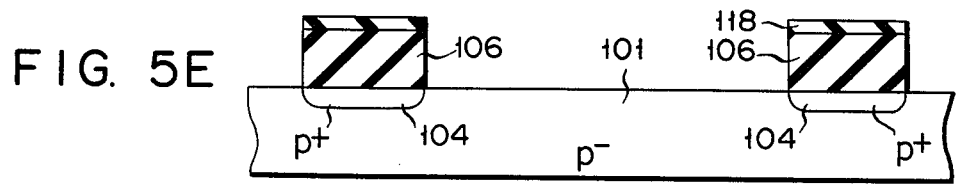

[ii] An aluminum cover film was then deposited to a thickness of 2,000 Å on the entire wafer surface. At this time, as shown in FIG. 5C, the aluminum cover film was separated into a portion 105a on the resist pattern 103 and a portion 105b on the silicon nitride film 118 due to the step portion defined by the edges of the resist pattern. Subsequently, the resist pattern 103 was removed to lift off the aluminum cover film portion 105a thereon to form an aluminum pattern 105b free from a portion corresponding to the intended element region (as shown in FIG. 5D). Thereafter, silicon nitride film 118 and thermal oxidation film 102 were selectively etched by the reactive ion etching method with the aluminum pattern 105b used as a mask to form a field oxide film 106 covered by the silicon nitride film 118, followed by the removal of the aluminum pattern 105b (as shown in FIG. 5E).

Figure 5F:
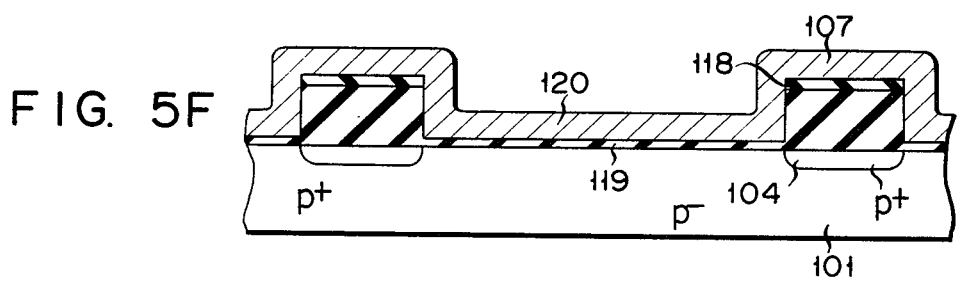
Figure 5G:
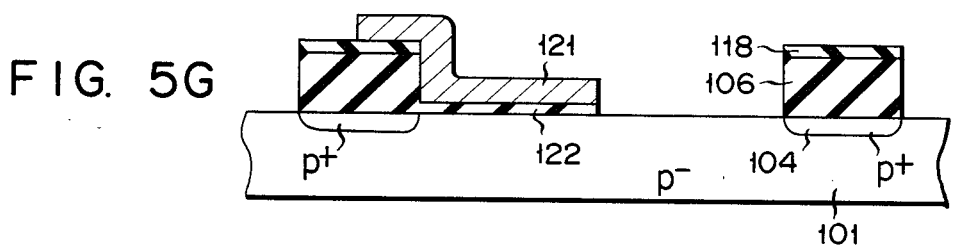
Figure 5H:
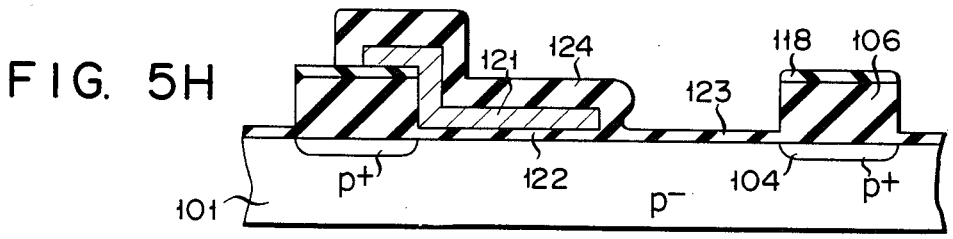

[iii] A thermal oxidation film 119 with a thickness of 400 Å, which serves as a first gate electrode film, was then grown on the island element region (substrate portion) surrounded by the field oxide film 106 through a thermal oxidation treatment, followed by the deposition of a phosphorus-doped polycrystalline silicon film 120 which serves as a first gate electrode (as shown in FIG. 5F). The phosphorus-doped polycrystalline silicon film 120 was subsequently patterned with a resist pattern (not shown) formed by the photoetching method and then used as a mask to form a first layer gate electrode 121. Thereafter, the thermal oxidatin film 119 was selectively etched using NH$_4$F as the etchant and the gate electrode 121 as a mask for about 40 seconds to obtain a first gate oxide film 122 (as shown in FIG. 5G). At this time, the field oxide film 106 was not reduced at all since it was covered by the silicon nitride film 118 (as shown in FIG. 5G).

[iv] The wafer was then thermally treated in a wet oxygen atmosphere at 850° C. At this time, an oxide film 123 with a thickness of 1,100 Å was grown on the exposed portion of the p-type silicon substrate 101, while an oxide film 124 with a thickness of 4,000 Å was grown around the phosphorus-doped polycrystalline silicon first layer gate electrode 121. Subsequently, the oxide film 123 on the substrate 101 was removed by etching the entire surface using NH$_4$F for about 120 seconds. At this time, the thickness of the field oxide film 106 was not reduced at all by the long etching process, since it was covered by the silicon nitride film 118 as shown in FIG. 5I.

[v] The wafer was then subjected to a thermal oxidation treatment in an oxygen atmosphere at 1,000° C. to grow a thermal oxidation film 750 Å thick which serves as a second gate oxide film. Subsequently, a phosphorus-doped polycrystalline silicon film serving as a second layer gate electrode was deposited on the entire surface and patterend to form the second layer gate electrode 125, followed by the selective etching of the thermal oxidation film using NH$_4$F and with the electrode 125 used as a mask to form the second gate oxide film 126 (as shown in FIG. 5J). Thereafter, an n+-type diffusion layer 127 was formed as a digit line in the silicon substrate 101 by diffusing arsenic. Then, a CVD-SiO$_2$ film 128 was deposited on the entire surface and processed to form contact holes. Finally, an aluminum interconnection layer 129 was provided to complete the MOS dynamic RAM (as shown in FIG. 5K).

Figure 5I:
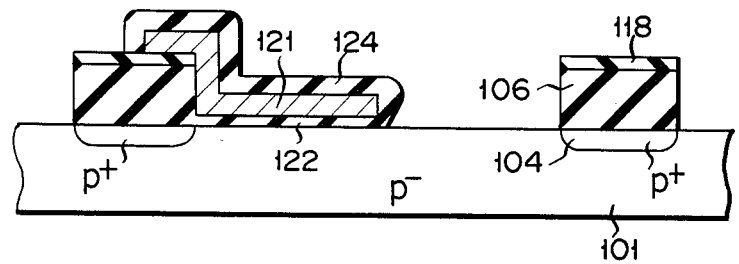
Figure 5J:
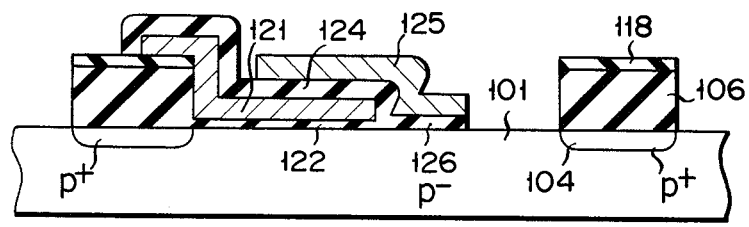
Figure 5K:
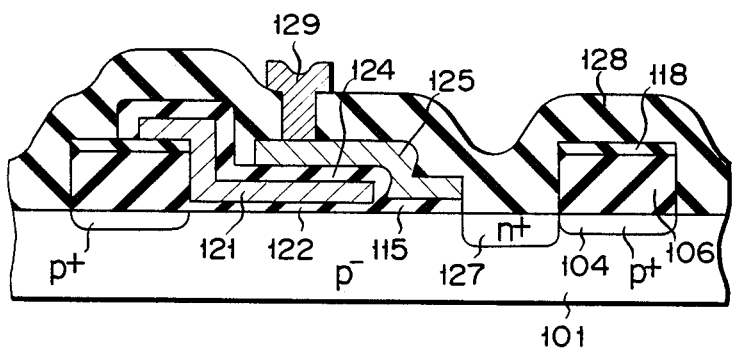

It is to be understood that in this example, the reduction of the thickness of the field oxide film 106 at the time of removing the element region oxide film using the NH$_4$F etchant as in FIGS. 5G, 5I and 5J is prevented since the field oxide film 106 is covered and protected by the field oxide film 118. Thus, the intended thickness (5,000 Å) of the field oxide film 106 can be maintained up to the last step, so that a MOS dynamic RAM having the required field inversion voltage can be obtained.

While in this example the silicon nitride film (protective film) and thermal oxidation film (insulating film) have been etched together to form the field oxide film, it is also possible to perform the selective etching of the protective film first by means of the photoetching process and then form a resist pattern and effect the doping of a field inversion prevention impurity before etching insulating film.

Further, while in this example the CVD-SiO$_2$ film 128 has been deposited the inter-layer insulation while leaving the silicon nitride film 118, it is also possible to remove the silicon nitride film 118 before the deposition of the CVD-SiO$_2$ film.

Further examples of the invention, which are applied again to the manufacture of MOS type semiconductor devices, will now be described with reference to FIGS. 6A through 6G and 7A through 7E.

EXAMPLE 4

Figure 6A:
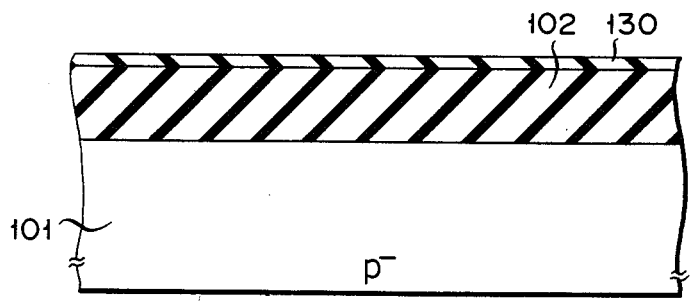

[i] A p- type silicon substrate 101 with a plane index (100), as shown in FIG. 6A, was subjected to a thermal oxidation treatment in a wet oxygen atmosphere at 1,000° C. to grow a thermal oxidation film (insulating film) 102 with a thickness of 5,000 Å. Then, a phosphorus-doped glass film (PSG film) 130 having a faster etching rate than the thermal oxidation film 102, was deposited to a thickness of 1,000 Å on the thermal oxidation film.

Figure 6B:
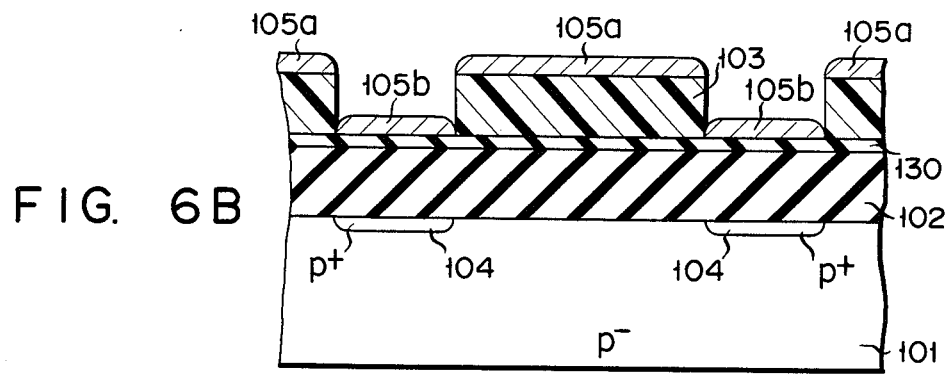
Figure 6C:
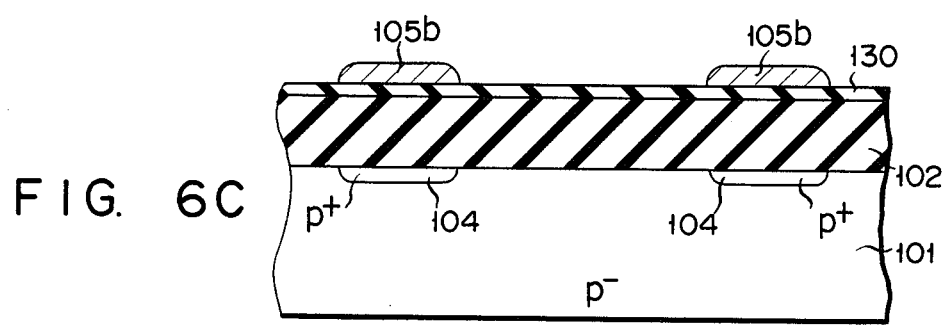
Figure 6D:
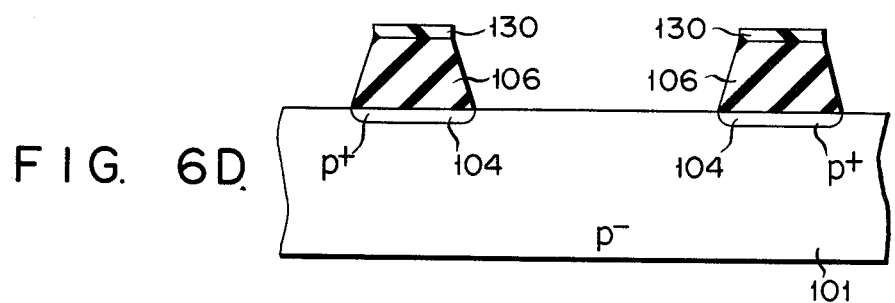

[ii] A photoresist film was then coated on the entire surface and patterned by the photoetching process to form a resist pattern 103 covering a portion of the film 130 corresponding to an intended element region. Subsequently, boron, a field inversion prevention impurity, was selectively ion implanted into the substrate 101 through the PSG film 130 and thermal oxidation film 102 with an acceleration voltage of 240 keV and a dose of $1 \times 10^{13}/cm^2$ and with the resist pattern used as a mask to form a p+-type field inversion prevention layer 104. Thereafter, an aluminum cover film with a thickness of 2,000 Å was vacuum deposited on the entire surface. At this time, the aluminum cover film was separated into an aluminum cover film portion 105a on the resist pattern 103 and a portion 105b on the PSG film 130 due to the step portion defined by the edges of the PSG film 130, as shown in FIG. 6B. Afterwards, the resist pattern 103 was removed to lift off the aluminum cover film portion 105a thereon and the aluminum cover film 105b was left on the portion of the PSG film 130 corresponding to an intended field region (as shown in FIG. 6C). The PSG film 130 and thermal oxidation film 102 were then selectively etched using an NH$_4$F etchant and with the remaining aluminum cover film 105b used as a mask, followed by the removal of the remaining aluminum cover film 105b. In this step, a field oxide film 106 was formed having sloped edges, as shown in FIG. 6D, due to a faster etching rate of the PSG film 130 than the thermal oxidation film 102.

Figure 6E:
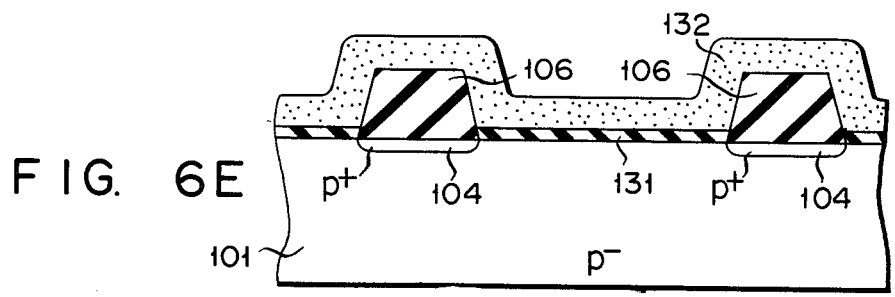
Figure 6F:
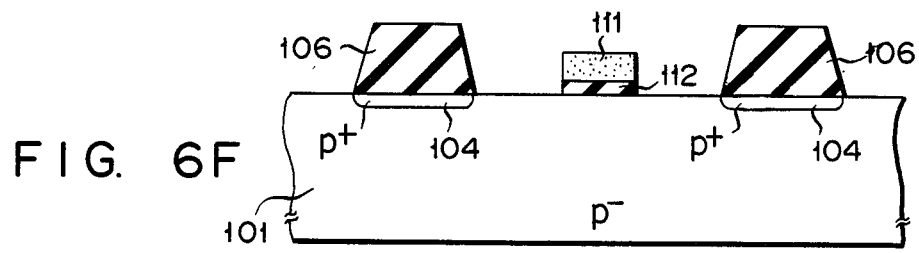
Figure 6G:
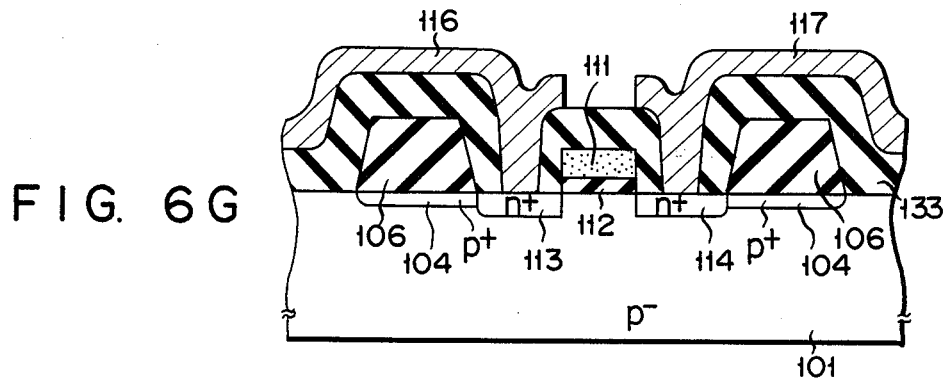

[iii] The PSG film 130 on the field oxide film 106 was then removed through an etching treatment using a mixture liquid composed of water and fluoric acid (in proportions of 20:1) for about 10 seconds. Subsequently, an oxide film 131 having a thickness of 400 Å, which serves as a gate oxide film, was grown through a thermal oxidation treatment. Thereafter, a phosphorous-doped polycrystalline silicon film 132 with a thickness of 4,000 Å was deposited on the entire surface (as shown in FIG. 6E). The polycrystalline silicon film 132 was then patterned by reactive ion etching. A resist pattern (not shown) formed by a photoetching method was used as a mask to form a gate electrode 111, followed by the selective etching of the oxide film 131 with the electrode 111 as a mask to form a gate oxide electrode 112 (as shown in FIG. 6F). Arsenic was then diffused or ion implanted into the silicon substrate 101 with the gate electrode 111 and field oxide film 106 as a mask to form n+-type source and drain regions 113 and 114. Afterwards, a layer 133 was deposited on the entire surface and provided with contact holes. Finally, an aluminum film was deposited and patterned to form an aluminum gate lead electrode (not shown) and aluminum source and drain lead electrodes 116 and 117, thus completing the MOS type semiconductor device (as shown in FIG. 6G).

It is to be understood that in these examples the field oxide film 106 having the sloped edges could be formed as a result of the etching of the thermal oxidation film 102. Accordingly, owing to the sloped edges of field oxide film 106, even if patterning is carried out by a reactive ion etching on phosphorus-doped polycrystalline silicon preliminarily deposited, it is possible to prevent the polycrystalline silicon from remaining in an element region portion adjacent to the edges of the field oxide film 106, even though the etching proceeds from the surface in the downward direction as is peculiar to the reactive ion etching (FIG. 6E). Thus, it is possible to obtain a highly reliable MOS type semiconductor device free from any short-circuit between the gate the source or drain region.

In addition, since the field oxide film 106 has sloped edges, it is possible to prevent breakage of the aluminum lead electrodes 116 and 117 that might otherwise be caused by a sharp field oxide film edge corner. Further, since the bird's beak characteristic of the selective oxidation method does not result, it is possible to lay out the field oxide film 106 without allowing for size reduction of the element region due to any bird's beak. This enables the integration density of the MOS semiconductor device to be increased.

EXAMPLE 5

Figure 7A:
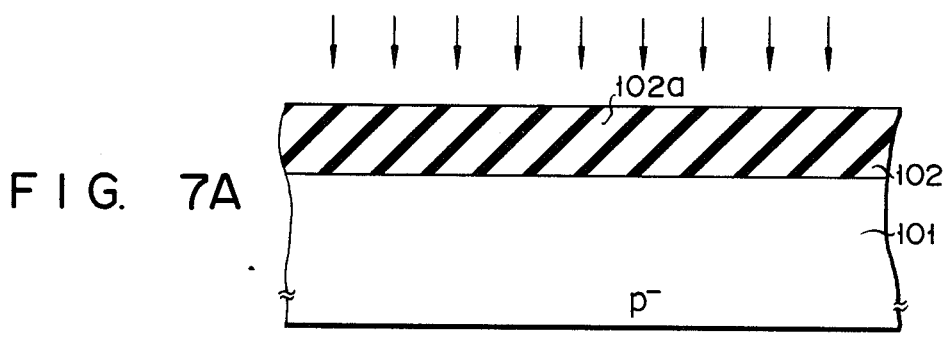

A p- type silicon substrate 101 with a plane index (100) was subjected to a thermal oxidation treatment in a wet oxygen atmosphere at 1,000° C. to grow a thermal oxidation film 102 with a thickness of 5,000 Å, as shown in FIG. 7A. Active radical CF$_4$ gas was then caused to bombard the entire surface of the thermal oxidation film 102, thereby denaturing a superficial portion 102a of the thermal oxidation film 102 to a state having a higher etching rate than the inner portion of the film 102.

Figure 7B:
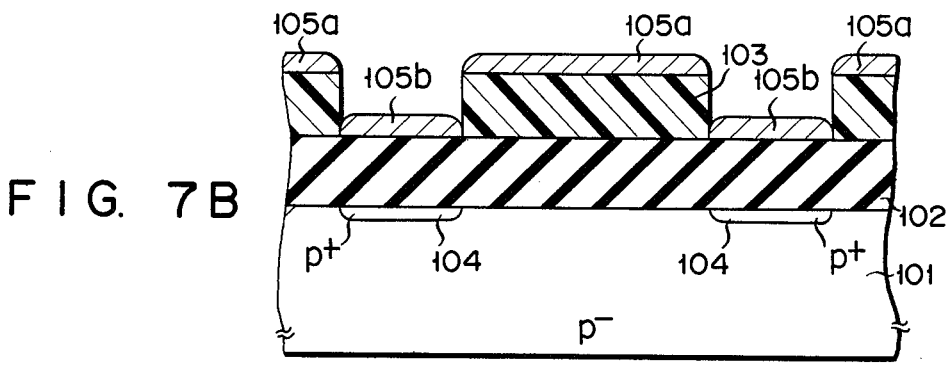

[ii] A photoresist film was then coated on the entire surface of the oxidation film 102 and patterned by photoetching to form a resist pattern 103 covering a portion of the film 102 corresponding to an intended element region. Subsequently, boron was selectively ion implanted under the same condition as in the previous Example 1 with the resist pattern used as a mask to form a p+ type field inversion prevention layer 104. Thereafter, an aluminum cover film was vacuum deposited on the entire wafer surface. At this time, the aluminum cover film was separated into the portion 105a on the resist pattern 103 and a portion 105b on the thermal oxidation film 102 due to the step of the edges between the thermal oxidation film 102 (as shown in FIG. 7B). The resist pattern 103 was then removed to lift off the aluminum cover film 105a thereon and let the aluminum cover film 105b be left on a portion of the thermal oxidation film 102 corresponding to an intended field region (as shown in FIG. 7C). The thermal oxidation film 102 was then selectively etched using an NH$_4$F solution as an etchant and the remaining aluminum cover film 105b as a mask. In this step, a field oxide film 106 having sloped edges as shown in FIG. 7D was obtained due to a higher etching rate of the inner portion of the thermal oxidation film 102 than the superficial portion having been subjected to the active radical bombardment by the CF₄ gas. Afterwards, the same steps as in the previous Example 4 were carried out to obtain a highly reliable, highly densely integrated MOS semiconductor device (as shown in FIG. 7E) which was free from any residual polycrystalline silicon and also free from any breakage in aluminum interconnecting layers.

Examples of the invention applied to the manufacture of MOS semiconductor devices will now be described with references to FIGS. 8A and 8B, 9, 10 and 11A through 11B.

EXAMPLE 6

The steps [i] and [ii] in the previous Example 1 (FIGS. 3A through 3E) were carried out to form the element isolation region 106.

Figure 8A:
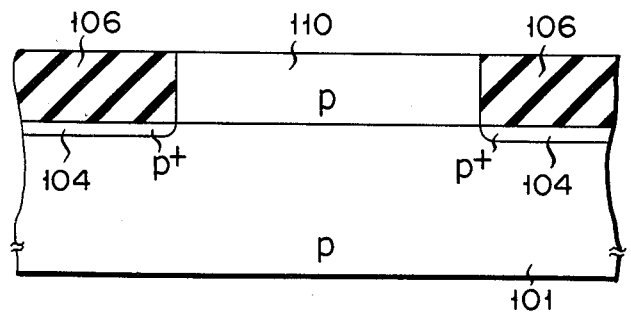

[iii] A p type single crystal silicon layer having the same thickness as the element isolation region 106 was then grown by the selective epitaxial growth method. In this step, single crystal silicon of the same p-conductivity type as the substrate 101 was selectively grown as a single crystal silicon element region 110 only on the island portion of the substrate 101 isolated by the element isolation region 106 as shown in FIG. 8A. Prior to the formation of source and drain regions to be described hereinafter, boron may further be doped for controlling the threshold value of the single crystal silicon element region 110.

Figure 8B:
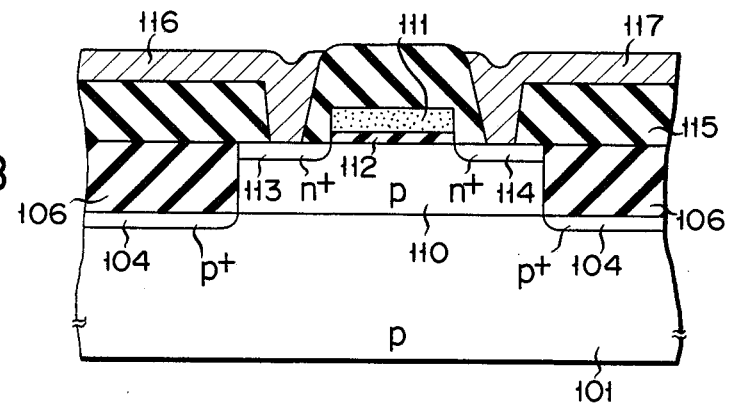

[iv] The element region 110 consisting of the p-type single cyrstal silicon and isolated by the element isolation region 106 was then thermally oxidized to grow an oxide film with a thickness of 400 Å. Subsequently, a phosphorus-doped polycrystalline silicon film with a thickness of 3,000 Å was deposited on the entire surface of the oxide film and then a resist pattern was formed by the photoetching method. This resist pattern was used as a mask to pattern the polycrystalline silicon film by reactive ion etching to form a gate electrode 11. Thereafter, the oxide film was selectively etched with the gate electrode 111 as a mask to form a gate oxide film 112. Afterwards, arsenic was selectively diffused or ion implanted into the p-type single crystal silicon element region 110 with the gate electrode 111 and element isolation region 106 as a mask to form n⁺-type source and drain regions 113 and 114. A CVD-SiO₂ film 115 was then deposited on the entire surface and provided with contact holes. Finally, an aluminum cover film was deposited and patterned to form an aluminum gate lead electrode (not shown) and aluminum source and drain lead electrodes 116 and 117, thus completing a MOS semiconductor substrate (as shown in FIG. 8B).

Figure 9:
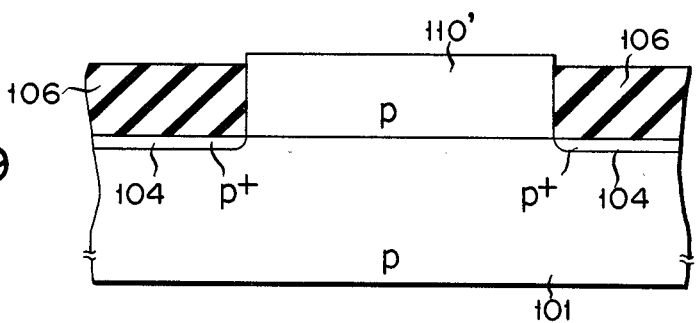

While in this example the single crystal silicon constituting the element region has been epitaxially grown to the same thickness as the element isolation region 106, it is also possible to form an element region 110' by epitaxially growing single crystal silicon to a thickness greater than the thickness of the element isolation region 106 as shown in FIG. 9.

Figure 10:
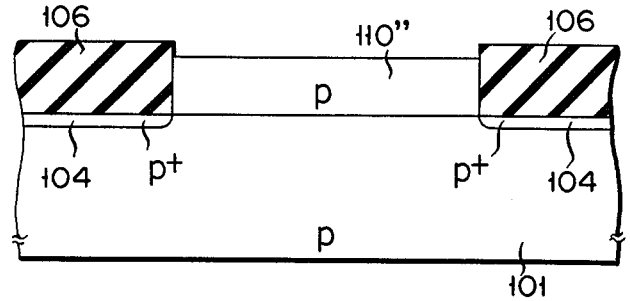

As a further alternative, an element region 110" having a thickness smaller than the thickness of the element isolation region 106 may be epitaxially grown as shown in FIG. 10.

EXAMPLE 7

The steps [i] and [ii] in the first Example 1 (FIGS. 3A through 3E) were carried out to form the element isolation region 106.

Figure 11A:
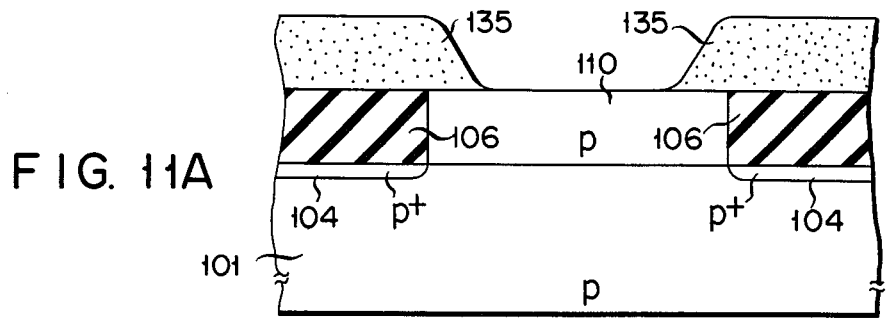

[iii] Silicon was then epitaxially grown on the entire surface and substantially to the same thickness as the element isolation region 106. In this step, the single crystal silicon 110 was deposited on the element region (exposed portion of the silicon substrate), while a polycrystalline silicon film 135 was deposited on the field oxide film 106 (as shown in FIG. 11A). Substantially, the selective etching of the polycrystalline silicon film 135 on the field oxide film 106 was done by using, for instance, a blend liquid composed of fluoric acid, nitric acid and acetic acid in proportions of 1:3:8 (as shown in FIG. 11B). [iv] Thereafter, the same step as the step [iv] in the preceding Example 6 was carried out, thus obtaining a similar MOS type semiconductor device to that shown in FIG. 8B.

Figure 11B:
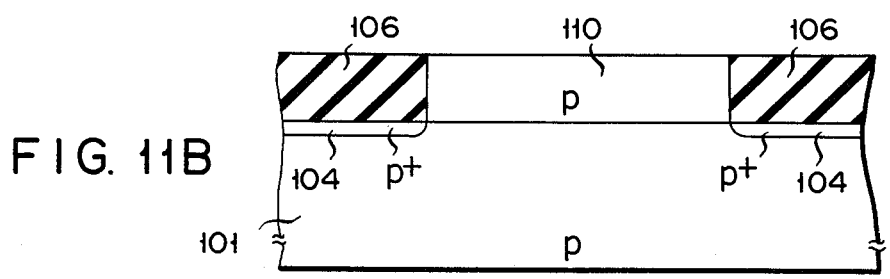

According to the invention, the p type single crystal element region 110 which is substantially flush with the element isolation region 106 can be formed on the portion of the silicon substrate 101 isolated by the element isolation region 106 as shown in FIGS. 8A and 11B. That is, the element region and element isolation region can be formed on the silicon substrate without formation of any step between them. Thus, it is possible to avoid any residual resist remaining along the edges of the element isolation region 106 after the photoetching of the resist film coating, which is carried out after the growth of the oxide film and subsequent deposition of the phosphorus-doped polycrystalline silicon film in the step [iv]. This permits formation of a resist pattern having a satisfactory dimensional precision, and hence high precision formation of the gate electrode 111. In addition, with the element isolation region 106 and p type single crystal silicon element region 110 being flush with each other, it is possible to avoid any residual phosphorus-doped polycrystalline silicon portions of the element region 110 adjacent to the edges of the element isolation region 106 after the selective etching of the polycrystalline silicon film by the reactive ion etching process using the resist pattern as a mask in the step [iv]. Thus, it is possible to obtain a highly reliable MOS type semiconductor device free from any short-circuit between the gate electrode 111 and source region 113 or drain region 114. Further, it is possible to prevent breakage of the aluminum source and drain lead electrodes 116 and 117 which otherwise could be caused by any sharp edges of the element isolation region 106 in the step [iv].

Furthermore, the bird's beak characteristic of the selective oxidation method, will never be generated in the step of forming the element isolation region. Thus, the element isolation region can be layed out without any allowance for any size reduction of the element region 110 due to any bird's beak, and this enables the manufacture of a higher integration density MOS type semiconductor device.

Examples of the invention applied to the manufacture of complementary MOS field-effect semiconductor devices, which can prevent latch-up and lateral diffusion of the well, will now be described.

EXAMPLE 8

Figure 12A:
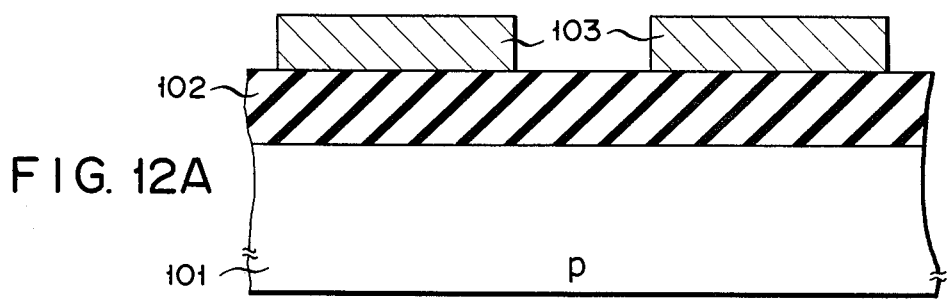
Figure 12B:
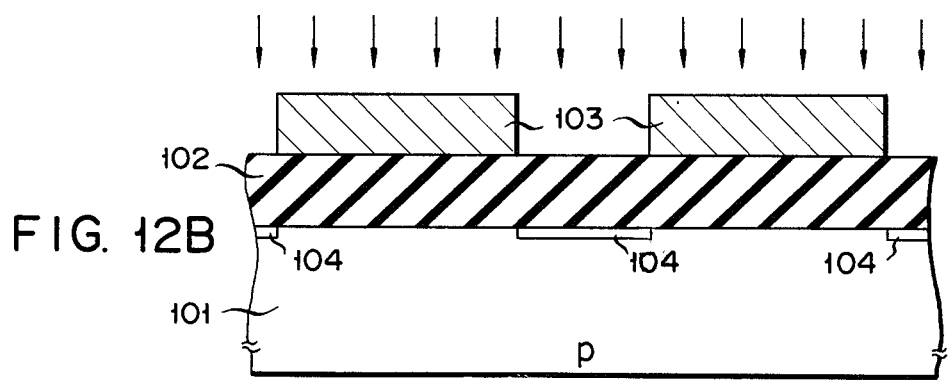

[i] A p type silicon substrate 101 with a plane index (100) was subjected to a thermal oxidation treatment in a wet oxygen atmosphere at 1,000° C. to cause growth of a thermal oxidation film (insulating film) 102 with a thickness of 1 μm. A photoresist was then coated on the entire surface of the thermal oxidation film 102 and patterned by the photoetching process to form a resist pattern (mask pattern) covering a portion of the film 102 corresponding to an intended element region (as shown in FIG. 12A). Subsequently, boron, as a field inversion prevention impurity, was selectively ion implanted into the substrate 101 through the thermal oxidation film 102 with an accelerating voltage of 400 keV and a dose of $1 \times 10^{13}/cm^2$ and with the resist pattern 103 used as a mask, followed by heat treatment to form a p+ type field inversion prevention layer 104 (as shown in FIG. 12B).

Figure 12C:
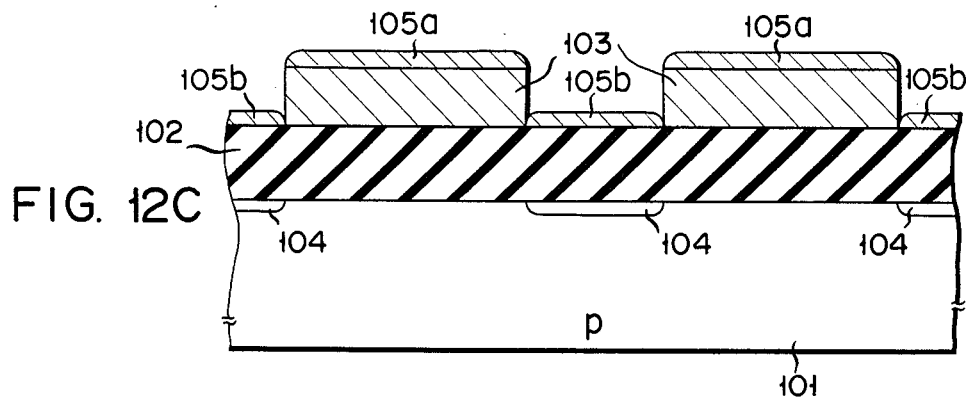
Figure 12D:
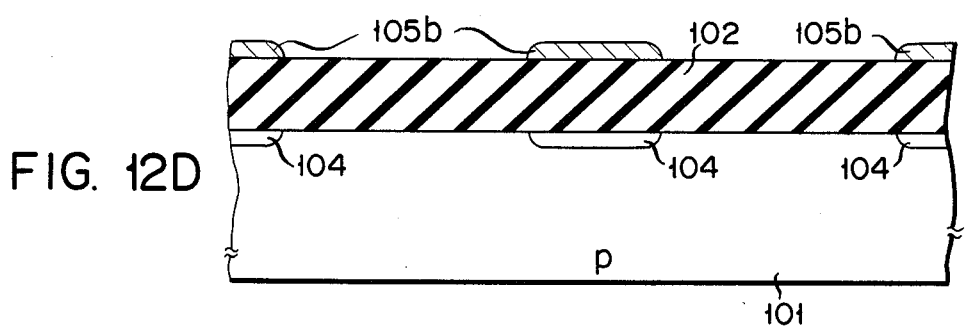
Figure 12E:
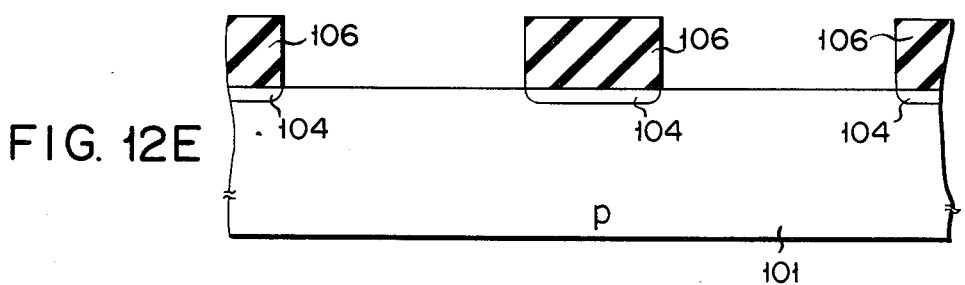

[ii] An aluminum cover film was then vacuum deposited to a thickness of 2,000 Å on the top surface. The aluminum cover film at this time was separated as shown in FIG. 12C into a portion 105a on the resist pattern 103 and the remaining portion 105b on the thermal oxidation film 102 due to the step defined between the edges of the resist pattern 103 and the thermal oxidation film 102. Subsequently, the resist pattern 103 was removed to lift off the aluminum cover film portion 105a thereon and leave the aluminum cover film portion 105b on the portion of the thermal oxidation film 102 corresponding to an intended element isolation region (as shown in FIG. 12D). The thermal oxide film 102 was then selectively etched by reactive ion etching with the remaining aluminum cover film 105b as a mask to form an element isolation region (field oxide film) 106, followed by the removal of the remaining aluminum film 105b on the element isolation region 106 (as shown in FIG. 12E).

Figure 12F:
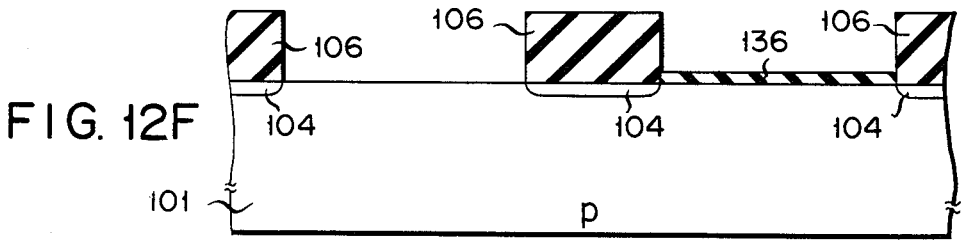

[iii] A thermal oxidation film with a thickness of, for instance, 1,000 Å, was then formed on the top wafer surface and photoetched to obtain a thermal oxide film 136 left only on an intended well formation region (as shown in FIG. 12F).

Figure 12G:
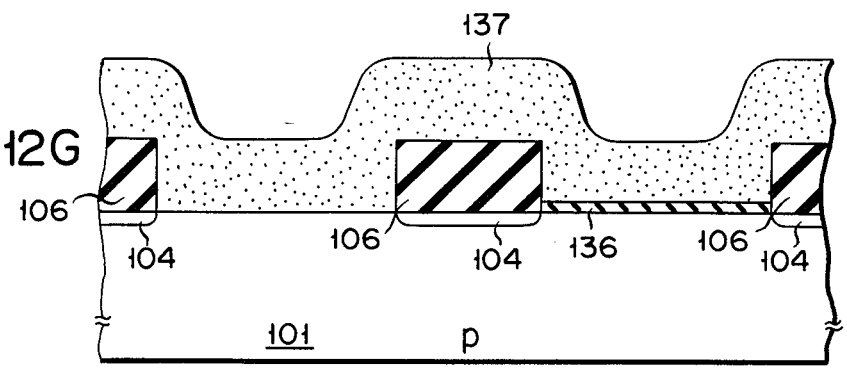
Figure 12H:
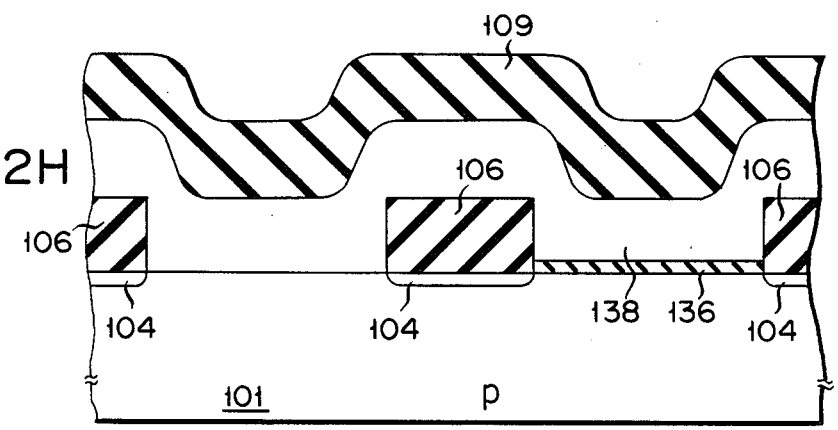
Figure 12I:
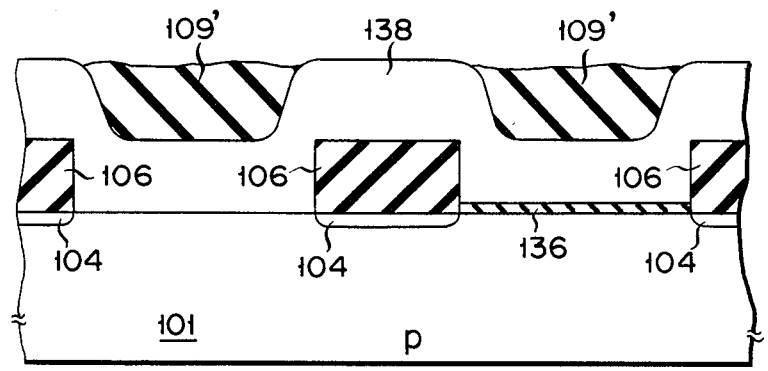
Figure 12J:
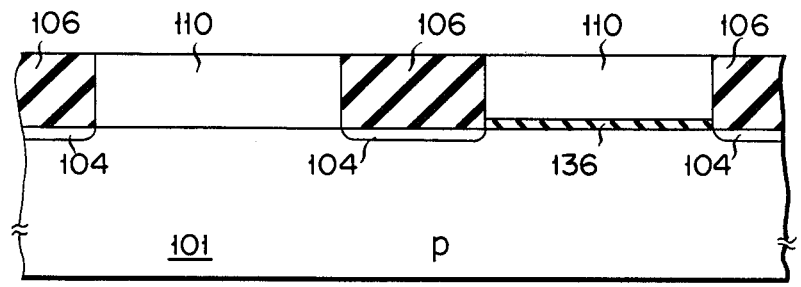

Subsequently, a polycrystalline silicon layer 137 of the same thickness as the element isolation region 106 was deposited on the top surface as shown in FIG. 12G. The polycrystalline silicon layer 137 was then irradiated with a laser beam for conversion into a single crystal silicon layer 138 with the portion of silicon substrate 101 interfacing therewith providing the nuclei of crystallization. Thereafter, a silicon nitride film 109 was deposited on the single crystal silicon layer 138 (as shown in FIG. 12H). Afterwards, the wafer was processed by reactive ion etching. In this step, a silicon nitride film 109' was left in a self-aligned fashion only on the recessed portion of the single crystal silicon layer 138 as shown in FIG. 12I due to a lower etching rate of a portion of the silicon nitride film deposited in the recessed portion of the single crystal silicon layer 138 than that of the silicon nitride film portion on the flat portion of the single crystal silicon layer. The remaining silicon nitride film 109' and single crystal silicon layer 138 were then etched at the same etching rate to obtain an element region 110 consisting of the p type single crystal silicon only on the island portion of the silicon substrate 101 isolated by the element isolation region 106, as shown in FIG. 12J.

Figure 12K:
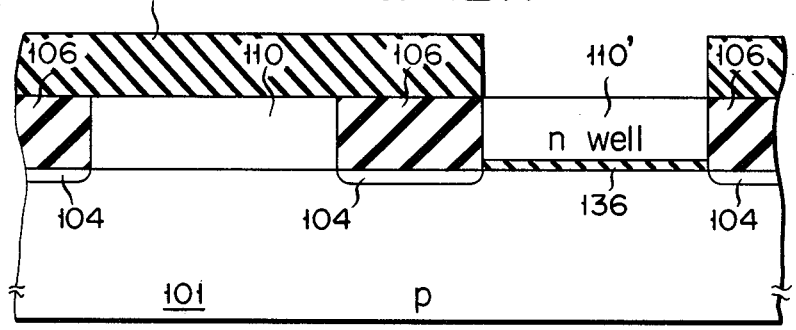

A resist film pattern 139 was then formed by the photoetching process. Phosphorus was then ion implanted with an accelerating voltage of 200 keV and a dose of $5 \times 10^{11}/cm^2$ only into the well region by using the resist film pattern as a mask, followed by a heat treatment, for instance at 1,200° C., to form an n-type well 110' (as shown in FIG. 12K).

Figure 12L:
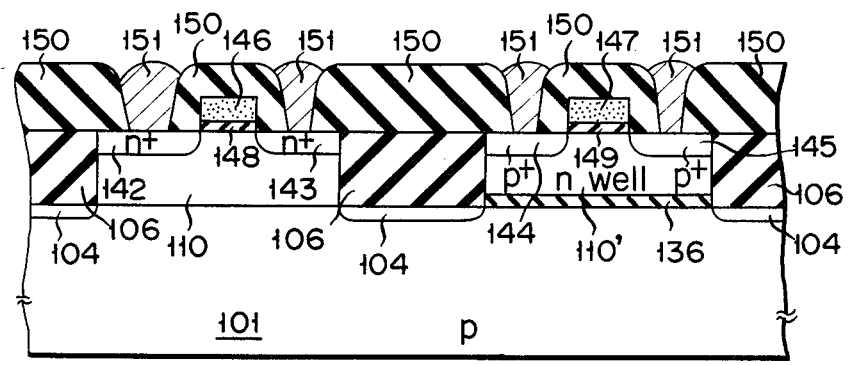

Thereafter, the same process as the step [iv] in Example 1 was carried out to obtain a complementary MOS field-effect transistor as shown in FIG. 12L. In FIG. 12L, numerals 142 and 144 designate drain regions, numerals 143 and 145 designate source regions, numerals 146 and 147 designate gate electrodes, numerals 148 and 149 designate gate oxide films, each numeral 150 designates a CVD-SiO$_2$ film, and numeral 151 designates lead electrodes.

EXAMPLE 9

The steps [i] and [ii] in the preceding Example 8 (FIGS. 12A through 12E) were carried out to form the element isolation region (field oxide film). In this Example 9 however, the formation of the field inversion prevention layers 104 were omitted.

Figure 13A:
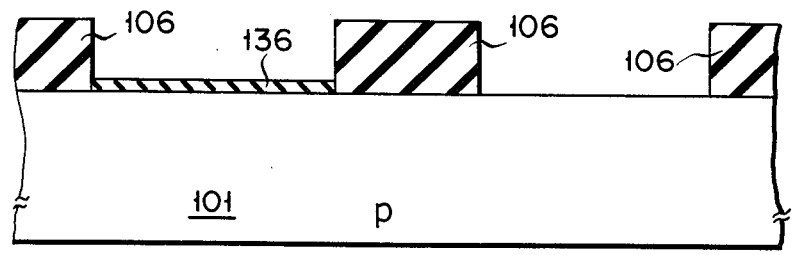

[iii] A thermal oxidation film, having a thickness of 1,000 Å, was then formed on the nitride surface and photoetched to leave a thermal oxidation film 136 only on the element region other than an intended well formation region (as shown in FIG. 13A).

Figure 13B:
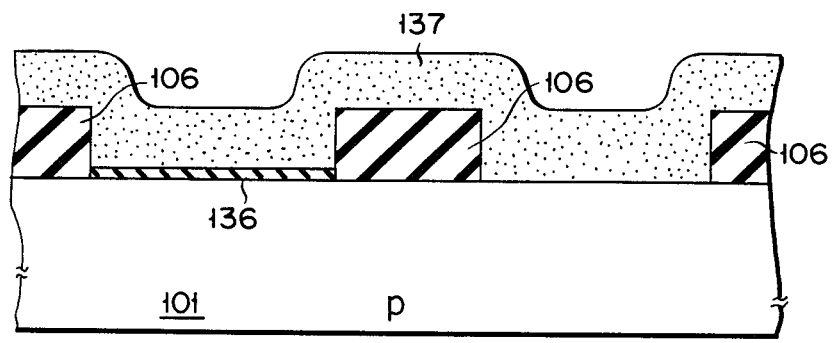
Figure 13C:
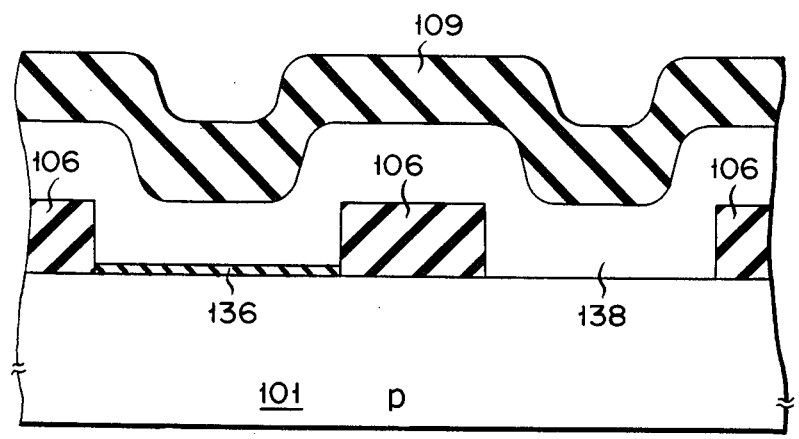
Figure 13D:
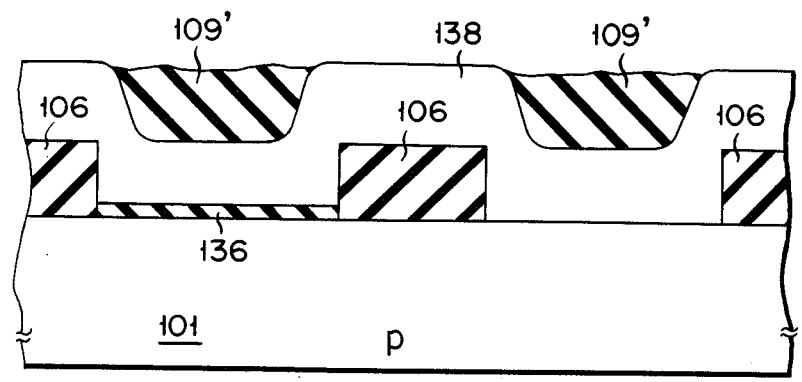
Figure 13E:
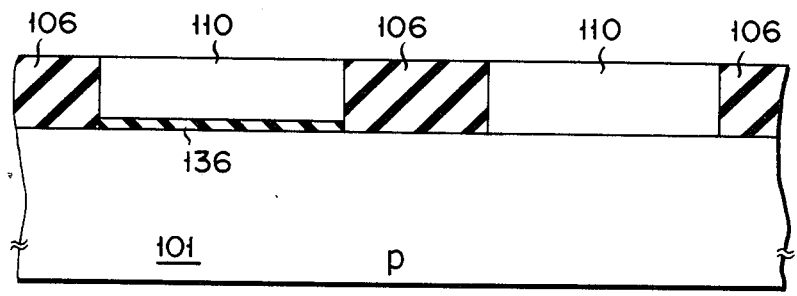

Subsequently, a polycrystalline silicon layer 137, having the same thickness as the element isolation region 106, was deposited on the entire surface as shown in FIG. 13B. The polycrystalline silicon layer 137 was then entirely irradiated with a laser beam for conversion into a p-type single crystal silicon layer 138 with the portion of the silicon substrate 101 interfacing with the polycrystalline silicon layer 137 providing nuclei for crystallization (as shown in FIG. 13C). Thereafter, the wafer was processed by reactive ion etching. In this step, a silicon nitride film 109' was left only on the recessed portion of the single crystal silicon layer 109 due to a lower etching rate of a portion of the silicon nitride film deposited on the recessed portion of the single crystal silicon layer 138 than that of the silicon nitride film portion on the flat portion of the single crystal silicon layer, as shown in FIG. 13D. The remaining silicon nitride film 109' and single crystal silicon layer 138 were then etched at the same etching rate to obtain an element region 110 consisting of the p-type single crystal silicon only on the island portion of the silicon substrate 101 isolated by the element isolation region 106, as shown in FIG. 13E.

Figure 13F:
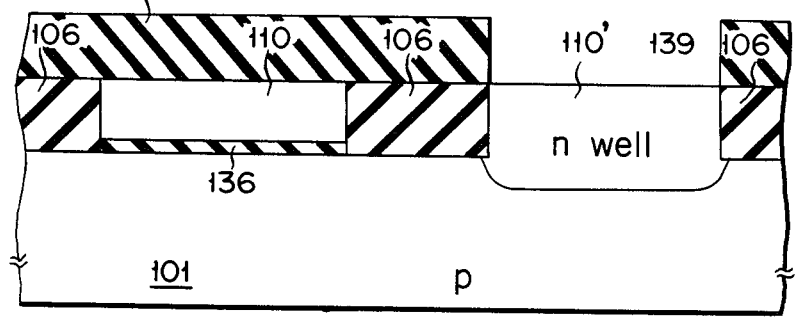

A resist film pattern 139 was then formed by the photoetching process and was used as a mask to ion implant phosphorus, for instance with an accelerating voltage of 200 keV and a dose of $5 \times 10^{11}/cm^2$, only into the well region, followed by a heat treatment, for instance at 1,200° C., to form an n-type well 110' (as shown in FIG. 13F).

Figure 13G:
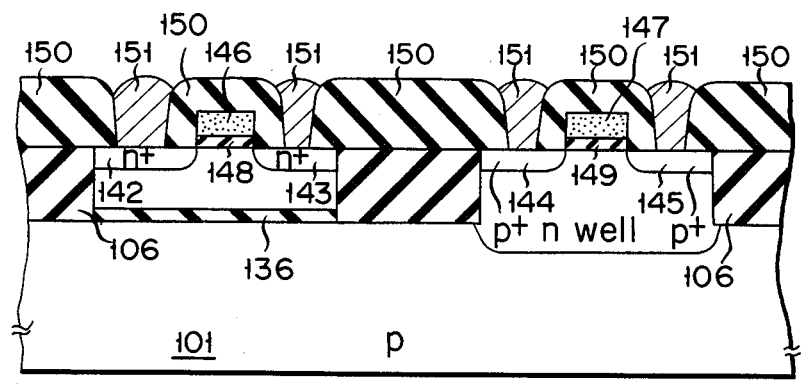

Afterwards, the same process as the step [iv] in Example 1 was carried out to obtain a complementary MOS field-effect transistor as shown in FIG. 13G. In FIG. 13G, numerals 142 and 144 designate drain regions, numerals 143 and 145 designate source regions, numerals 146 and 147 designate gate electrodes, numerals 148 and 149 designate gate oxide films, numeral 150 designates a CVD-SiO$_2$ film, and numeral 151 designates lead electrodes.

The complementary MOS field-effect transistors obtained in Examples 8 and 9 are free from latch-up because the p- and n-channel element sections are insulated from each other by the insulating film. In addition, the element region and element isolation region are flush with each other. Further, the transistor of Example 8 is free from lateral diffusion of the well region, and the transistor of Example 9 eliminates field inversion prevention layers.

While in Examples 8 and 9 the n-type well has been formed in the p-type substrate, it is also possible to form a p-type well in the n-type substrate. In this latter case, either phosphorus or arsenic may be ion implanted as a field inversion prevention impurity, and boron may be ion implanted for the p-type well. Further, while the ion implantation of the field inversion prevention inpurity has been performed through the field oxide film, it is also possible to carry out ion implantation by PEP prior to the formation of the field oxide film and form the element isolation region by PEP subsequent to the formation of the field oxide film.

Further, while the impurity has been introduced into the n type well by ion implantation, it is also possible to introduce the impurity by diffusion from PSG or by phosphorus diffusion.

EXAMPLE 10

This example, and each of the following Examples 11 and 12, concerns the manufacture of n-channel MOS field-effect transistors by making use of a method in which an etching-proof cover film used as a mask for an element isolation insulating film is partly denatured for imparting a selective etching property with respect to the non-denatured portion.

Figure 14A:
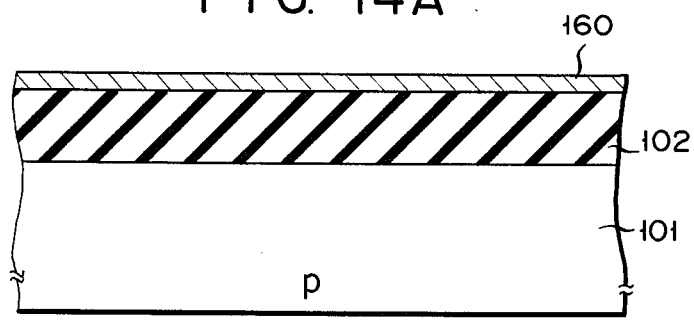
Figure 14B:
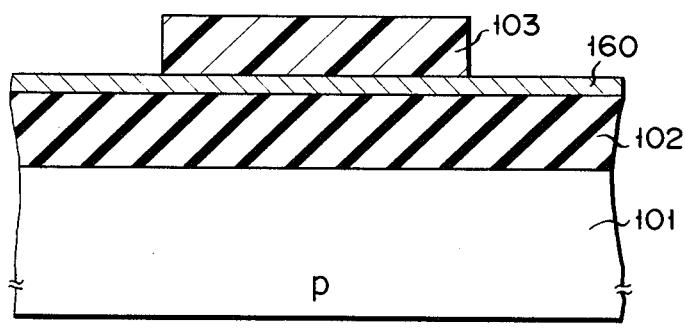
Figure 14C:
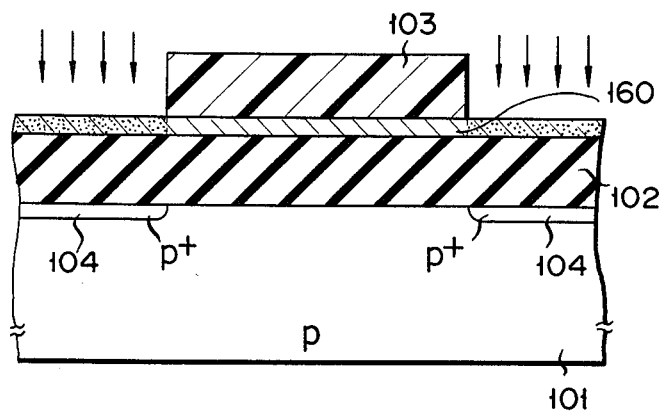

[i] A p-type silicon substrate 101 of a high resistivity, as shown in FIG. 14A, was subjected to a thermal oxidation treatment in a wet oxygen atmosphere at 1,000° C. to grow a thermal oxidation film (insulating film) 102 with a thickness of 5,000 Å. An aluminum film 160 was then deposited by the vacuum deposition method to a thickness of 1,000 Å atop the entire top surface. A photoresist film was coated on the entire top surface and photoetched to form a resist pattern 103 covering an intended element region (as shown in FIG. 14B). Thereafter, boron, for instance, was selectively ion implanted into the exposed aluminum film with an acceleration voltage of 40 keV, a dose of $1 \times 10^{15}/cm^2$ using the resist pattern 103 as a mask. Further, boron is ion implanted as a field inversion prevention impurity with an accelerating voltage of 240 keV and a dose of $1 \times 10^{13}/cm^2$ with the resist pattern 103 as a mask, followed by a heat treatment. At this time, the boron field inversion prevention impurity was doped through that portion of the aluminum cover film 160 which was not covered by the resist pattern 103 and also through the thermal oxidation film 102 into the silicon substrate 101 thereunder, thus forming a p+-type field inversion prevention layer 104 (as shown in FIG. 14C).

Figure 14D:
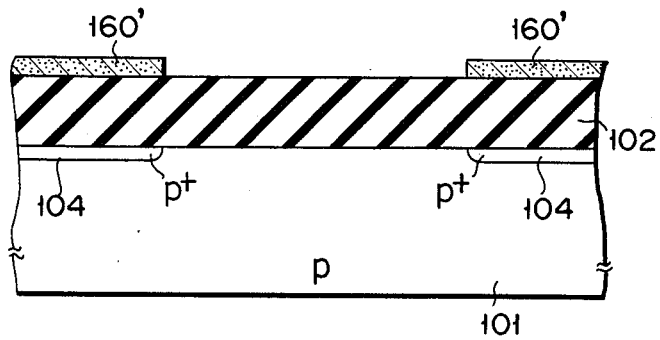
Figure 14E:
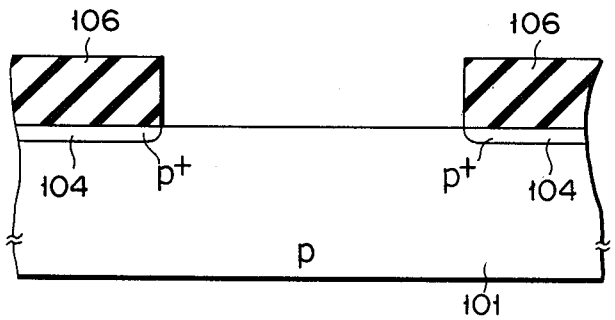

[ii] The resist pattern 103 was then removed, and the exposed aluminum cover film 160 free from mask was etched with a blend liquid, composed of nitric acid, acetic acid, phosphoric acid and water (in proportions of 6:3:150:10). At this time, the portion of the aluminum cover film, into which boron had been ion implanted in the previous boron ion implantation into the aluminum cover film 160 and through which boron ions were implanted into the substrate 101, was either not etched or scarcely etched. Thus, only the aluminum cover film portion, into which no boron had been ion implanted, was selectively etched away to leave an aluminum cover film 160' on a portion of the thermal oxidation film 102 corresponding to the intended element isolation region (as shown in FIG. 14D). Subsequently, the thermal oxidation film 102 was selectively etched by reactive ion etching using the remaining aluminum cover film 160' as a mask to form the element isolation region 106, followed by etching away the aluminum cover film 160' (as shown in FIG. 14E).

Figure 14F:
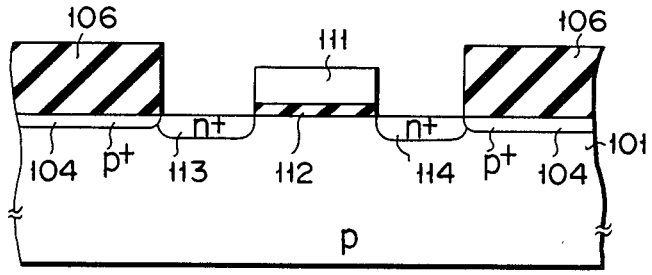

[iii] Thereafter, a gate electrode 111 was formed via a gate oxide film 112 on the isolated element region on the p type silicon substrate 101 surrounded by the element separation region, by the ordinary process. Arsenic was then ion implanted using the gate electrode 111 and element isolation region 106 as a mask, to form n+-type source and drain regions 113 and 114 in the element region, thus completing an n-channel MOS field-effect transistor (as shown in FIG. 14F).

EXAMPLE 11

While in the previous Example 10 the ion implantation has been carried out in two distinct steps, in this example it was effected in a single step for doping the superficial layer of the silicon substrate 101 underneath the exposed aluminum cover film and thermal oxidation film. For the rest, the manufacturing steps and conditions are the same as in the preceding Example 10.

More particularly, after the formation of the aluminum cover film 160 and resist pattern 103 as shown in FIGS. 14A and 14B, boron, as the field inversion prevention impurity, was ion implanted with an accelerating voltage of 200 keV and a dose of $5 \times 10^{14}/cm^2$ with the resist pattern 103 used as a mask such that the impurity profile peak is on the side of the thermal oxidation film 102 in the neighborhood of the interface thereof. At this time, boron was doped through the aluminum cover film 160 not covered by the resist pattern 103 and aluminum cover film 160 into a superficial layer of the silicon substrate 101 thereunder to form a p+-type field inversion prevention layer 104 (as shown in FIG. 14C).

It was found that the MOS field effect transistors obtained in Examples 10 and 11, were free from any intrusion of oxide film into the element region as is the case with the prior art selective oxidation method. Thus, Examples 10 and 11 of the present invention permit the layout of the resist pattern for the element region without any allowance for oxide film intrusion and hence results in a marked improvement of the integration density. In addition, the mask for the formation of the element isolation region can be prepared by simple means, because the aluminum cover film 160' is selectively left on the portion of the thermal oxidation film 102 corresponding to the intended element isolation region by making use of the fact that the aluminum cover film portion having been doped with impurity by ion implantation at the time of the formation of the field inversion prevention layer 104, is not etched or scarcely etched. Besides, at the time of etching the thermal oxidation film 102 with the remaining aluminum cover film 160' as a mask, alignment of the edges of the thermal oxidation film (element isolation region) and the edge of the p+-type field inversion prevention layer 104 can be obtained. This avoids the intrusion of boron into the element region. Furthermore it is possible to avoid the formation of any white ribbon in the element region. Thus, a MOS transistor having excellent element characteristics can be obtained.

While the above Examples 10 and 11 have concerned n-channel MOS field effect transistors, the invention is also applicable to the manufacture of p-channel MOS field-effect transistors. In this case, phosphorus or arsenic, for instance, may be ion implanted as the field inversion prevention impurity.

EXAMPLE 12

Figure 15A:
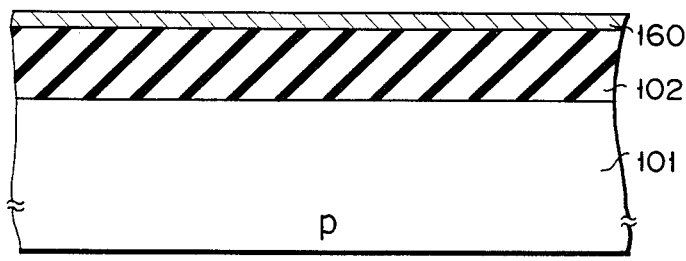
Figure 15B:
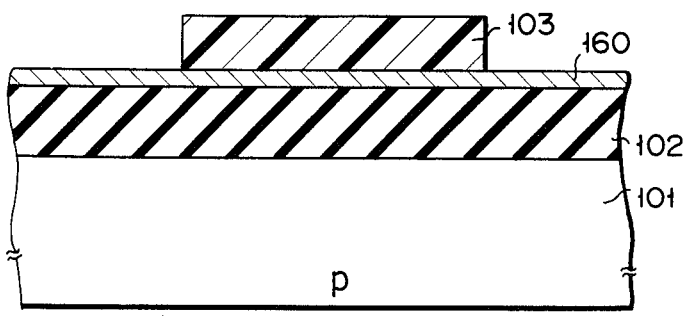
Figure 15C:
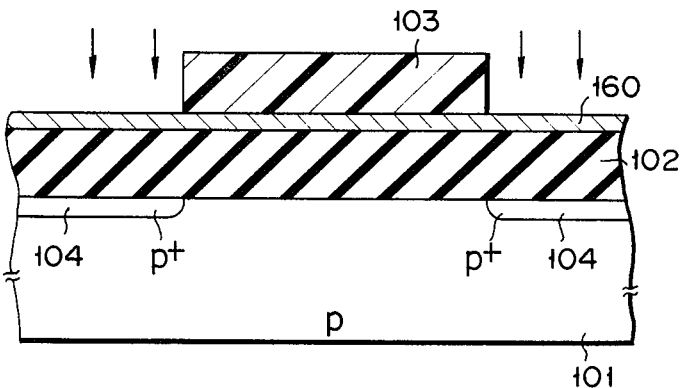

A p type silicon substrate 101 of a high resistivity (as shown in FIG. 15A) was subjected to a thermal oxidation treatment in a wet oxygen atmosphere at 1,000° C. to grow a 5,000 521 thick thermal oxidation film (insulating film) 102, followed by deposition of an aluminum cover film 160 (for instance to a thickness of 1,000 Å). A photoresist was then coated on the entire top surface and patterned by the photoetching process to form a resist film 103 covering a portion of the film 160 corresponding to an intended element region (as shown in FIG. 15B). Subsequently, boron, a field inversion prevention impurity, was ion implanted with an accelerating voltage of about 200 keV, and a dose of, for instance $1 \times 10^{13}/cm^2$ and using the resist film 103 used as a mask such that the impurity profile peak was found on the side of the insulating film in the neighborhood of the interface thereof. The boron was thus doped through the aluminum cover film 160 not covered by the resist film 103 through the thermal oxidation film 102 into a superficial portion of the silicon substrate 101 thereunder to form a boron ion layer 104 (as shown in FIG. 15C).

Figure 15D:
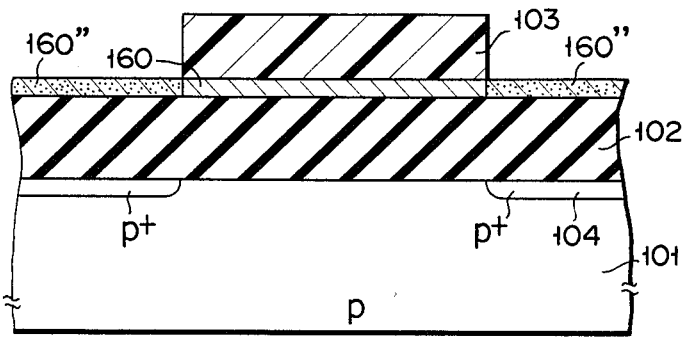

The exposed aluminum cover film 160 was then subjected to anodic oxidation with the resist film 103 as a mask to denature the aluminum cover film portion, which had been deposited with boron by the ion implantation, into an $Al_2O_3$ cover film 160'' (as shown in FIG. 15D).

Thereafter, steps similar to the steps [ii] and [iii] in the previous Example 10 (FIGS. 14A through 14F) were carried out to leave an $Al_2O_3$ cover film 160'' portion on the intended element separation region (as shown in FIG. 14D). The thermal oxidation film 102 on the element region was then removed, followed by the removal of the $Al_2O_3$ cover film 160'' (as shown in FIG. 14E).

[iii] Afterwards, a gate oxide film 112 and a gate electrode 111 were formed on the element region of the p-type silicon substrate 101 in the ordinary manner (as shown in FIG. 14F). Arsenic was then ion implanted with the gate electrode 111 as a mask to form $n^+$-type diffusion layer source 113 and drain 114, thus completing a MOS field-effect transistor (as shown in FIG. 14F).

The MOS field-effect transistor thus obtained was utterly free from the intrusion of the oxide film into the element region as in the case of the prior art selective oxidation method. Thus, Example 12 of the present invention permits the layout of the resist pattern for the element region without requiring allowance for any oxide film intrusion and hence results in a marked improvement of the integration density. In addition, at the time of the etching of the thermal oxidation film with the remaining aluminum cover film 160' used as a mask, alignment of the edges of the thermal oxidation film (element isolation region) and the edges of the $p^+$-type field inversion prevention layer can be obtained to avoid the intrusion of boron into the element region. Furthermore it is possible to avoid the formation of any white ribbon in the element region.

While the above example was concerned with an n-type MOS field-effect transistor, it also is possible to manufacture a p-channel MOS field-effect transistor, using phosphorus or arsenic, for instance, as the ion to be implanted as the impurity.

A further example of the invention applied to a MOS dynamic RAM having a two-layer gate electrode structure, will now be described with reference to FIGS. 16A through 16C.

EXAMPLE 13

Figure 16A:
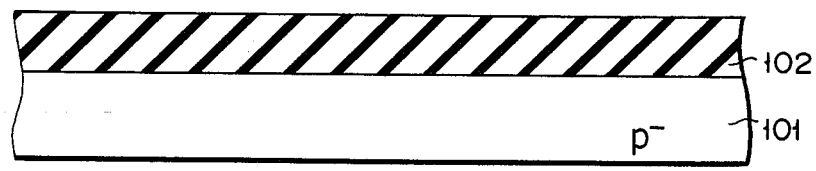
Figure 16B:
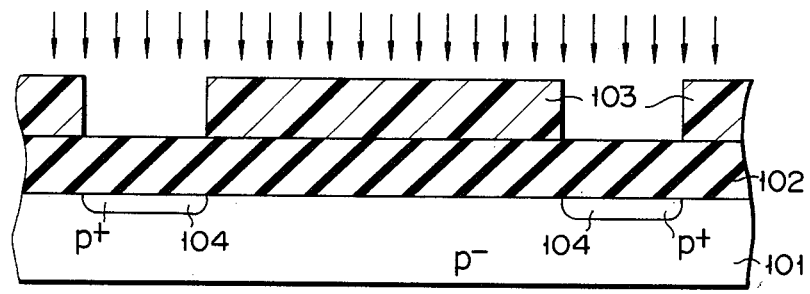
Figure 16C:
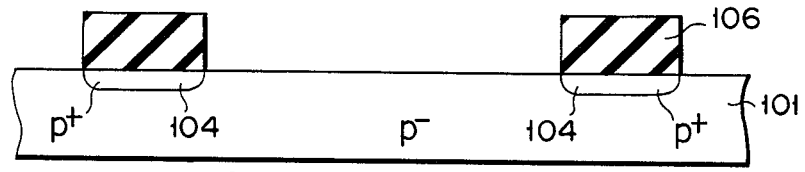

[i] A p-type silicon substrate 101 with plane index <100> (as shown in FIG. 16A) was subjected to a thermal oxidation treatment in a wet oxygen atmosphere to grow a thermal oxidation film (insulating film) 102. Subsequently, a resist pattern 103 covering a portion of the thermal oxidation film 102 corresponding to an intended element region, was formed by the photoetching process. Thereafter, boron was selectively ion implanted into the substrate 101 through the thermal oxidation film 102 with an accelerating voltage of 240 keV and a dose of $1 \times 10^{13}/cm^2$ and with the resist pattern 103 used as a mask to form a $p^+$-type field inversion prevention layer 104 (as shown in FIG. 16B).

[ii] The wafer was then exposed to a reactive gas containing hydrogen fluoride. At this time, the silicon nitride film and thermal oxidation film 102 right beneath the resist film of the resist pattern 103 were selectively removed to form a field oxide film 106 (as shown in FIG. 16C).

[iii] Afterwards, steps similar to the steps [iii], [iv] and [v] in the previous Example 3 (FIGS. 5F through 5K) were carried out to obtain a MOS dynamic RAM.

This example can be modified similar to the previous Example 3.

It is also possible to employ other methods than the above-described silicon nitride deposition method (the 1st and 2nd modes or Examples 1 and 2) for leaving a non-monocrystal semiconductor (such as silicon) layer only at the recessed portion. Such a method comprises filling at least the recessed portion of the non-monocrystal semiconductor layer corresponding to the element region with a cover film consisting of a resist or a melting material, carrying out an etching of the entire top surface thereby leaving the cover film deposited in the recessed portion, and etching the non-monocrystal semiconductor layer while employing the cover film left in the recessed portion as a mask, thereby leaving the non-monocrystal semiconductor layer only at the recessed portion.

What we claim is:

1. A method of manufacturing a semiconductor device, comprising:
    (a) a step of forming a field region formation insulating film on a semiconductor substrate;
    (b) a step of forming a mask pattern covering a portion of said insulating film corresponding to an intended element region;
    (c) a step of ion implanting a field inversion prevention impurity into an intended element isolation region of said substrate with said mask pattern as a shield;
    (c') a step of forming a protective film as an etch stop on said field region formation insulating film; and
    (d) a step of removing a portion of said insulating film beneath said mask pattern, thereby forming an element isolation region on the substrate.

2. A method of manufacturing a semiconductor device according to claim 1, which further comprises after the step (d):
    (e) a step of depositing a non-monocrystal semiconductor layer and covering said non-monocrystal semiconductor layer into a single crystal semiconductor layer by irradiation with an energy beam;

(f) a step of depositing silicon nitride atop said single crystal semiconductor layer to form silicon nitride film on a region of said single crystal semiconductor layer at least including a recessed portion thereof corresponding to a region isolated by said element isolation region; and (g) a step of processing said silicon nitride film by the reactive ion etching process to let a portion of said silicon nitride layer be left on said recessed portion of said single crystal semiconductor layer and then etching by means of a reactive ion etching method said single crystal semiconductor layer and said silicon nitride film to form an element region consisting of the single crystal semiconductor layer on a portion of the semiconductor substrate isolated by said element isolation region.

3. A method of manufacturing a semiconductor device according to claim 1, which further comprises after the step (d):

(e) a step of depositing a non-monocrystal semiconductor layer;

(f) a step of depositing silicon nitride atop said semiconductor layer to form a silicon nitride film on a region of said non-monocrystal semiconductor layer at least including a recessed portion thereof corresponding to a region isolated by said element isolation region;

(g) a step of processing said silicon nitride film by the reactive ion etching method to let said silicon nitride film be left on said recessed portion of said non-monocrystal semiconductor layer; and (h) a step of etching by means of a reactive ion etching method said non-monocrystal semiconductor layer and the remaining silicon nitride film to let a portion of the non-monocrystal semiconductor layer be buried on a portion of the semiconductor substrate isolated by said element isolation region and then converting said buried non-monocrystal semiconductor layer into a single crystal layer by irradiating with an energy beam.

4. A method of manufacturing a semiconductor device according to claim 1, which further comprises a step (a″) of processing said insulating film such as to increase the etching rate of a superficial portion thereof compared to the inner portion.

5. A method of manufacturing a semiconductor device according to claim 4, wherein said step (a′) includes a step of covering said insulating film with a cover film of a material having a higher etching rate than said insulating film.

6. A method of manufacturing a semiconductor device according to claim 5, wherein the material of said cover film is a member of a group consisting of phosphorus-containing glass, arsenic-containing glass and boron and phosphorus-containing glass.

7. A method of manufacturing a semiconductor device according to claim 4, wherein said step (a′) includes a step of subjecting said insulating film to the bombardment by an active radical gas.

8. A method of manufacturing a semiconductor device according to claim 7, wherein said active radical gas is a member of group consisting of active $CF_4$ and $C_2F_6$ gases.

9. A method of manufacturing a semiconductor device according to claim 1, which further comprises after the step (d):

a step of depositing a single crystal semiconductor layer by the selective epitaxial growth method on a portion of said semiconductor substrate isolated by said element isolation region to form the element region.

10. A method of manufacturing a semiconductor device according to claim 1, which further comprises after the step (d):

a step of epitaxially growing silicon on the entire surface to form a single crystal silicon layer on the portion of said semiconductor substrate isolated by said element isolation region and also form a polycrystalline silicon layer on said element isolation region; and a step of selectively etching said polycrystalline silicon layer.

11. A method of manufacturing a semiconductor device according to claim 1, in which said semiconductor device is a complementary MOS semiconductor device, and which further comprises after the step (d):

(e) a step of forming an insulating film on at least a portion of the semiconductor substrate consisting of a well region or a portion of the element region other than a well region;

(f) a step of depositing a non-monocrystal semiconductor layer on the entire surface;

(g) a step of converting said non-monocrystal semiconductor layer into a single crystal layer by irradiation with an energy beam;

(h) a step of depositing silicon nitride on said single crystal semiconductor layer to form a silicon nitride film on a portion of said single crystal semiconductor layer at least including a recessed portion thereof corresponding to a region isolated by said element isolation region; and (i) a step of processing said silicon nitride layer by the reactive ion etching method to let a portion of the silicon nitride film be selectively left on said recessed portion of said single crystal semiconductor and then etching by means of a reactive ion etching method said single crystal semiconductor layer and said silicon film to form an element region constituted by the single crystal semiconductor layer on said semiconductor substrate portion isolated by said element isolation region.

12. A method according to claim 11, wherein the step (e) comprises a step of forming the insulating film only on the well region.

13. A method according to claim 11, wherein the step (e) comprises a step of forming the insulating film only a portion of the element region other than said well region.

14. A method according to claim 11, 12 or 13, wherein the thickness of the insulating film is less than 3,000 Å.

15. A method according to any one of claims 1 to 3 or 4 to 13, which further comprises before or after the step (c) a step of depositing an etching-proof layer on the entire top surface, and removing the etching-proof layers deposited on said mask pattern together with said mask pattern, and wherein the step (d) comprises a step of selectively etching said insulating film with said remaining etching-proof film used as a mask to form an element isolation region.

16. A method of manufacturing a semiconductor device according to claim 1, which further comprises after the step (d):

a step of depositing a non-monocrystal semiconductor layer; and a step of etching said non-monocrystal semiconductor layer to let a portion of the non-monocrystal semiconductor layer be buried on a portion of the semiconductor substrate isolated by said element isolation region and then converting said buried non-monocrystal semiconductor layer into a single crystal layer by irradiating with an energy beam.

17. A method of manufacturing a semiconductor device according to any one of claims 1 to 3 or 4 to 13, which further comprises after the step (a):

a step of depositing a cover film having a property of permitting the selective etching of said insulating film and after the step (c):

a step (c″) of ion implanting an impurity into said cover film thereby denaturing the ion implanted portion of the cover film, and wherein the step (d) comprises:

a step of removing said mask pattern and removing a portion of said cover film which is not denatured; and a step of selectively etching said insulating film with said remaining denatured cover film used as a mask to form an element isolation region.

18. A method of manufacturing a semiconductor device according to claim 17, wherein the ion implantations of said steps (c) and (c″) are simultaneously effected.

19. A method of manufacturing a semiconductor device according to claim 17, wherein the ion implantations of said steps (c) and (c″) are separately effected.

20. A method of manufacturing a semiconductor device according to claim 19, wherein the order of the ion implanting step (c) and step (c″) are mutually interchanged.

21. A method of manufacturing a semiconductor device according to any one of claims 1 to 3 or 4 to 13, which further comprises after the step (a):

a step of depositing a cover film having a property of permitting the selective etching of said insulating film and after the step (c):

a step (c‴) of oxidizing or nitriding said cover film with said mask pattern as a mask, thereby denaturing said cover film, and wherein the step (d) comprises:

a step of removing said mask pattern and removing a portion of said cover film which is not denatured; and a step of selectively etching said insulating film with said remaining denatured cover film used as a mask to form an element isolation region.

22. A method of manufacturing a semiconductor device according to claim 21, wherein said step (c‴) is an anodic oxidation step.

23. A method of manufacturing a semiconductor device according to any one of claims 1 to 3 or 4 to 13, wherein said step (d) comprises exposing the wafer to a reactive gas containing hydrogen fluoride to selectively etch insulating film underneath the resist film so as to form a field insulating film.

24. A method of manufacturing a semiconductor device according to any one of claims 1 to 3 or 4 to 13 and 16, wherein said etching-proof film is made of a metal.

25. A method of manufacturing a semiconductor device according to claim 24, wherein said metal is aluminum.

26. A method of maufacturing a semiconductor device according to any one of claims 1 to 3 or 4 to 9, wherein said etching-proof film is made of metal silicide.

27. A method of manufacturing a semiconductor device according to any one of claims 1 to 3 or 4 to 9, wherein said insulating film is a member of a group consisting of a thermal oxidation film, a CVD-$SiO_2$ film, a silicon nitride film and an aluminum oxide film.

28. A method according to any one of claims 1 to 3 or 4 to 9, wherein said mask pattern is made of a resist material.

29. A method according to any one of claims 1 to 3 or 4 to 13, wherein said semiconductor substrate comprises an epitaxial growth layer.

30. A method according to any one of claims 1 to 3 or 4 to 13, wherein said semiconductor substrate comprises an insulating substrate and a semiconductor layer provided on the insulating substrate.

* * * * *